(12) United States Patent
Lee et al.

(10) Patent No.: US 12,144,198 B2
(45) Date of Patent: Nov. 12, 2024

(54) DISPLAY DEVICE

(71) Applicant: Samsung Display Co., LTD., Yongin-si (KR)

(72) Inventors: Baek Hee Lee, Seoul (KR); Beom Jin Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 440 days.

(21) Appl. No.: 17/522,450

(22) Filed: Nov. 9, 2021

(65) Prior Publication Data

US 2022/0310976 A1    Sep. 29, 2022

(30) Foreign Application Priority Data

Mar. 26, 2021    (KR) .......................... 10-2021-0039853

(51) Int. Cl.
| | |
|---|---|
| *H10K 50/854* | (2023.01) |
| *H10K 59/122* | (2023.01) |
| *H10K 59/35* | (2023.01) |
| *H10K 59/38* | (2023.01) |

(52) U.S. Cl.
CPC ......... *H10K 50/854* (2023.02); *H10K 59/122* (2023.02); *H10K 59/353* (2023.02); *H10K 59/38* (2023.02)

(58) Field of Classification Search
CPC .............. H01L 25/0753; H01L 27/156; H01L 27/1214; H01L 33/50; H01L 33/56; H01L 27/1248; H01L 33/505; H01L 2933/0091; H01L 33/58; H10K 59/124; H10K 59/877; H10K 50/854; H10K 59/122; H10K 59/353; H10K 59/38
See application file for complete search history.

(56) References Cited

U.S. PATENT DOCUMENTS

| | | | |
|---|---|---|---|
| 2020/0395516 A1 | 12/2020 | Chen et al. | |
| 2020/0403029 A1* | 12/2020 | Kim | ...................... H01L 27/156 |
| 2021/0074770 A1* | 3/2021 | Choe | ..................... G02B 5/201 |
| 2021/0359009 A1* | 11/2021 | Lee | ......................... H10K 59/38 |
| 2022/0199695 A1* | 6/2022 | Takiguchi | ................. G09F 9/30 |
| 2022/0262984 A1* | 8/2022 | Choi | ..................... H01L 33/505 |

FOREIGN PATENT DOCUMENTS

| | | | | |
|---|---|---|---|---|
| JP | WO2020209109 | * | 10/2020 | ............... G09F 9/30 |
| JP | 2020-184617 | | 11/2020 | |
| JP | 2020-205417 | | 12/2020 | |
| KR | 10-2010-0053409 | | 5/2010 | |
| KR | 10-2020-0130606 | | 11/2020 | |
| KR | 20200130606 | * | 11/2020 | ........... H01L 33/505 |

\* cited by examiner

*Primary Examiner* — Yasser A Abdelaziez
(74) *Attorney, Agent, or Firm* — KILE PARK REED & HOUTTEMAN PLLC

(57) ABSTRACT

A display device includes pixels; a first electrode and a second electrode disposed in each of the pixels, the first electrode and the second electrode being spaced apart from each other on a substrate; light-emitting elements disposed on the first electrode and the second electrode; a wavelength control layer disposed on the light-emitting elements; and a scattering layer disposed between the light-emitting elements and the wavelength control layer, the scattering layer comprising light-scattering particles, wherein the scattering layer is spaced apart from another scattering layer and is disposed in each of the pixels.

19 Claims, 18 Drawing Sheets

DISPLAY DEVICE

CROSS-REFERENCE TO RELATED APPLICATION(S)

This application claims priority to and benefits of Korean Patent Application No. 10-2021-0039853 under 35 U.S.C. § 119 filed on Mar. 26, 2021 in the Korean Intellectual Property Office, the entire contents of which are incorporated herein by reference.

BACKGROUND

1. Technical Field

The disclosure relates to a display device.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices may include a display panel such as an organic light-emitting display panel and a liquid-crystal display panel for displaying images. Among them, a light-emitting display panel may include light-emitting elements. For example, light-emitting diodes (LEDs) may include an organic light-emitting diode (OLED) using an organic material as a luminescent material, and an inorganic light-emitting diode using an inorganic material as a luminescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device in which a scattering layer is disposed between a wavelength control layer and light-emitting elements so that it is possible to improve the luminance uniformity of light incident on the wavelength control layer. Accordingly, the amount of light per area of the wavelength control layer is reduced, and thus it is possible to prevent damage to the wavelength control layer by the thermal energy of the light and to provide a display device with improved display quality.

It should be noted that objects of the disclosure are not limited to the above-mentioned objects; and other objects of the disclosure will be apparent to those skilled in the art from the following descriptions.

Aspects of the disclosure provide a display device that may include pixels; a first electrode and a second electrode disposed in each of the pixels, the first electrode and the second electrode being spaced apart from each other on a substrate; light-emitting elements disposed on the first electrode and the second electrode; a wavelength control layer disposed on the light-emitting elements; and a scattering layer disposed between the light-emitting elements and the wavelength control layer, the scattering layer comprising light-scattering particles. The scattering layer may be spaced apart from another scattering layer and may be disposed in each of the pixels.

Aspects of the disclosure also provide a display device that may include a substrate including an emission area and a non-emission area; a first electrode and a second electrode at least partially disposed in the emission area and spaced apart from each other; a light-emitting element disposed in the emission area and disposed on the first electrode and the second electrode; a wavelength control layer disposed in the emission area and disposed on the light-emitting element; and a scattering layer disposed in the emission area and disposed between the wavelength control layer and the light-emitting element. The scattering layer comprises a binder layer; and light-scattering particles dispersed in the binder layer.

The details of one or more embodiments of the subject matter described in this specification are set forth in the accompanying drawings and the description below.

According to an embodiment, a scattering layer including light-scattering particles may be disposed between light-emitting elements and a wavelength control layer. The scattering layer may scatter lights emitted from the light-emitting elements, each of which is a point light source, so that the lights are guided as if they are emitted from a surface light source. Accordingly, by dispersing the light emitted from the light-emitting elements and incident on the wavelength control layer, the area of the wavelength control layer on which the light is incident can become larger, and the light incident on the wavelength control layer can be uniformly distributed. If the area of the wavelength control layer on which the light emitted from the light-emitting elements is incident increases, the amount of the incident light per area of the wavelength control layer can be reduced. Accordingly, the distribution of the light incident on the wavelength control layer is uniform and the incidence area is increased, so that it is possible to prevent the wavelength control layer from being damaged by thermal energy of the light incident on the wavelength control layer. As a result, the display quality of the display device can be improved.

It should be noted that effects of the disclosure are not limited to those described above and other effects of the disclosure will be apparent to those skilled in the art from the following descriptions.

According to an embodiment, a display device may include pixels; a first electrode and a second electrode disposed in each of the pixels, the first electrode and the second electrode being spaced apart from each other on a substrate; light-emitting elements disposed on the first electrode and the second electrode; a wavelength control layer disposed on the light-emitting elements; and a scattering layer disposed between the light-emitting elements and the wavelength control layer, the scattering layer comprising light-scattering particles, wherein the scattering layer is spaced apart from another scattering layer and is disposed in each of the pixels.

The display device may further comprise a bank disposed along a boundary of each of the pixels on the substrate, wherein the bank may expose a portion of each of the first electrode and the second electrode, and the light-emitting elements may be disposed on the portion of each of the first electrode and the second electrode exposed by the bank.

At least a portion of a space adjacent to the bank may be filled with the scattering layer.

The wavelength control layer may be disposed in the space adjacent to the bank.

The scattering layer may overlap the light-emitting elements and the wavelength control layer in a thickness direction of the substrate, and contact a side surface of the bank.

The bank may comprise a lower bank; and an upper bank disposed on the lower bank and overlapping the lower bank in a thickness direction of the substrate, the scattering layer may be disposed in an area adjacent to the lower bank, and the wavelength control layer may be disposed in an area adjacent to the upper bank.

The pixels may comprise a first pixel emitting a first color; and a second pixel emitting a second color, and the wavelength control layer may comprise a first wavelength conversion pattern disposed in the first pixel and converting light of a third color into light of the first color; and a second wavelength conversion pattern disposed in the second pixel and converting the light of the third color into the light of the second color.

The scattering layer may comprise a first scattering layer disposed between the first wavelength conversion pattern and the light-emitting elements, and a second scattering layer disposed between the second wavelength conversion pattern and the light-emitting elements.

The scattering layer may further comprise a binder layer, and wherein the light-scattering particles may be dispersed in the binder layer.

The light-scattering particles may comprise inorganic particles including at least one of titanium oxide ($TiO_2$), aluminum oxide ($Al_2O_3$), indium oxide ($In_2O_3$), zinc oxide (ZnO), tin oxide ($SnO_2$), silica (Silica) and barium sulfate ($BaSO_4$), or polymer particles including at least one of polystyrene and polymethyl methacrylate (PMMA).

The display device may further comprise a first contact electrode electrically connecting the first electrode and first ends of the light-emitting elements; and a second contact electrode electrically connecting the second electrode and second ends of the light-emitting elements.

The scattering layer may be disposed on the first contact electrode and the second contact electrode.

The display device may further comprise a first capping layer disposed between the wavelength control layer and the scattering layer.

The display device may further comprise a second capping layer disposed on the wavelength control layer.

According to an embodiment, a display device may include a substrate comprising an emission area and a non-emission area; a first electrode and a second electrode at least partially disposed in the emission area and spaced apart from each other; a light-emitting element disposed in the emission area and disposed on the first electrode and the second electrode; a wavelength control layer disposed in the emission area and disposed on the light-emitting element; and a scattering layer disposed in the emission area and disposed between the wavelength control layer and the light-emitting element, wherein the scattering layer comprises a binder layer; and light-scattering particles dispersed in the binder layer.

The display device may further comprise a bank disposed in the non-emission area on the substrate, wherein the bank may surround the emission area.

The wavelength control layer and the scattering layer may not overlap the bank in a thickness direction of the substrate.

The scattering layer may contact a side surface of the bank.

The wavelength control layer may overlap the scattering layer in the thickness direction of the substrate.

A surface of the scattering layer facing the wavelength control layer may have a substantially flat surface.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
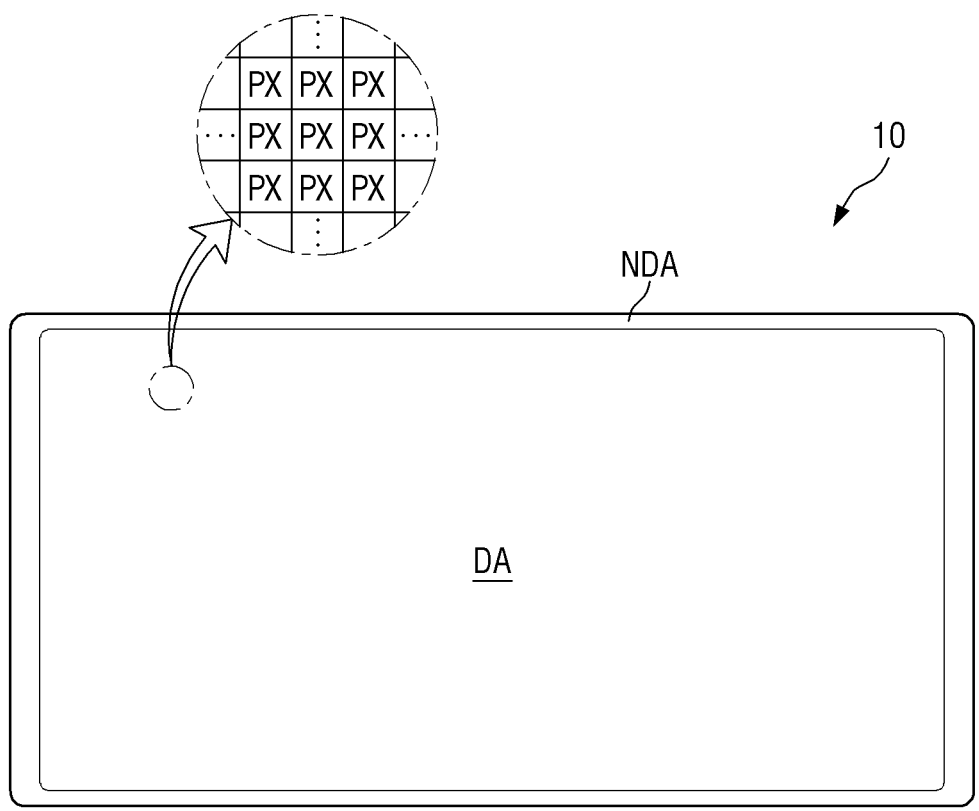
FIG. 1 is a schematic plan view of a display device according to an embodiment.
Figure 1:
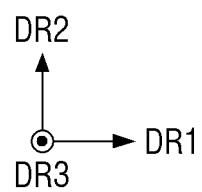

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device according to an embodiment.

Referring to FIG. 1, a display device 10 displays a moving image or a still image. A display device 10 may refer to any electronic device that provides a display screen. For example, the display device 10 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc., within the spirit and the scope of the disclosure.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, etc., within the spirit and the scope of the disclosure. In the following description, an inorganic light-emitting diode display panel is employed as an example of the display panel 10, but the disclosure is not limited thereto. Any other display panel may be employed as long as the technical idea of the disclosure can be equally applied.

A first direction DR1, a second direction DR2 and a third direction DR3 are defined in the drawings. The display device 10 according to the embodiments will be described with reference to the drawings. The first direction DR1 may be perpendicular to the second direction DR2 in a plane. The third direction DR3 may be perpendicular to the plane where the first direction DR1 and the second direction DR2 may be located or disposed. The third direction DR3 may be perpendicular to each of the first direction DR1 and the second direction DR2. In the following description of the display devices 10 according to the embodiments, the third direction DR3 refers to the thickness direction of the display device 10.

The display device 10 may have a substantially rectangular shape including longer sides in the first direction DR1 and shorter sides in the second direction DR2 when viewed from the top. Although the corners where the longer sides and the shorter sides of the display device 10 meet may form a right angle, this is merely illustrative. The display device 1 may have rounded corners. The shape of the display device 10 when viewed from the top is not limited to that shown. The display device 10 may have other shapes such as substantially a square, substantially a rectangle with substantially rounded corners (vertices), other polygons and substantially a circle.

A display surface may be located or disposed on one side or a side of the display device 10 in the third direction DR3, for example, the thickness direction. In the following description, the upper side of the display device 10 refers to the side in the third direction DR3 where images are displayed, and the upper surface of the display device 10 refers to the surface facing the side in the third direction DR3, unless specifically stated otherwise. The lower portion refers to the opposite side in the third direction DR3, and likewise the lower surface refers to a surface facing the opposite side in the third direction DR3. As used herein, the terms "left," "right," "upper" and "lower" sides refer to relative positions in case that the display device 10 is viewed from the top. For example, the right side refers to one side or a side in the first direction DR1, the left side refers to the other side in the first direction DR1, the upper side refers to one side or a side in the second direction DR2, and the lower side refers to the other side in the second direction DR2.

The display device 10 may include the display area DA and a non-display area NDA. In the display area DA, images can be displayed. In the non-display area NDA, images are not displayed.

The shape of the display area DA may follow the shape of the display device 10. For example, the shape of the display area DA may have a substantially rectangular shape generally similar to the shape of the display device 10 when viewed from the top. The display area DA may generally occupy the center of the display device 10.

The display area DA may include pixels PX. The pixels PX may be arranged or disposed in a matrix. The shape of each of the pixels PX may be substantially rectangular or substantially square when viewed from the top. It is, however, to be understood that the disclosure is not limited thereto. The shape of each of the pixels PX may have a substantially diamond shape having the sides inclined with respect to one direction or a direction. The pixels PX may be alternately arranged or disposed in stripes or the PENTILE™ pattern.

The non-display areas NDA may be disposed around the display area DA. The non-display area NDA may surround or may be adjacent to the display area DA entirely or partially. According to an embodiment, the display area DA may have a substantially rectangular shape, and the non-display areas NDA may be disposed to be adjacent to the four sides of the display area DA. The non-display area NDA may form the bezel of the display device 10. Lines, circuit drivers included in the display device 10, or pad areas on which external devices are mounted may be disposed in the non-display areas NDA.

Figure 2:
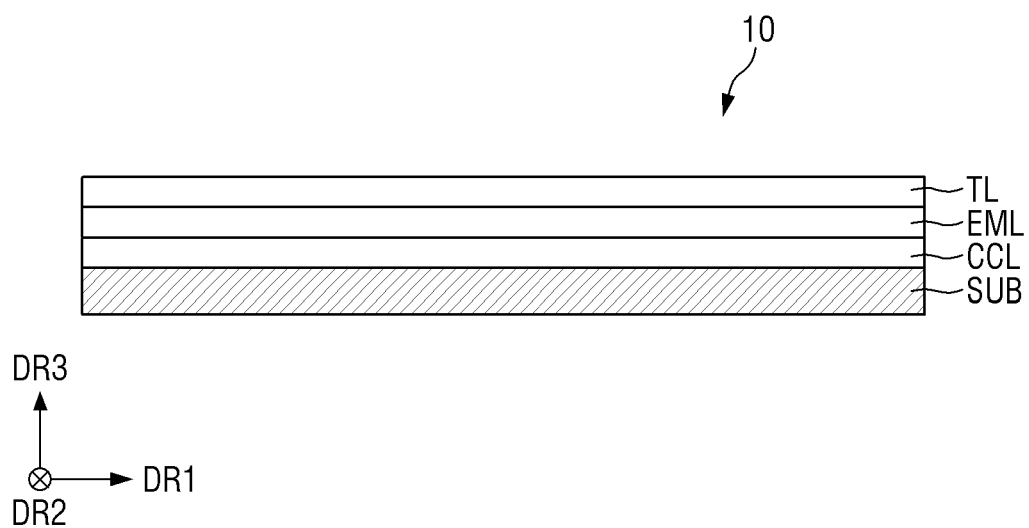
FIG. 2 is a schematic cross-sectional view of a display device according to an embodiment.
Figure 3:
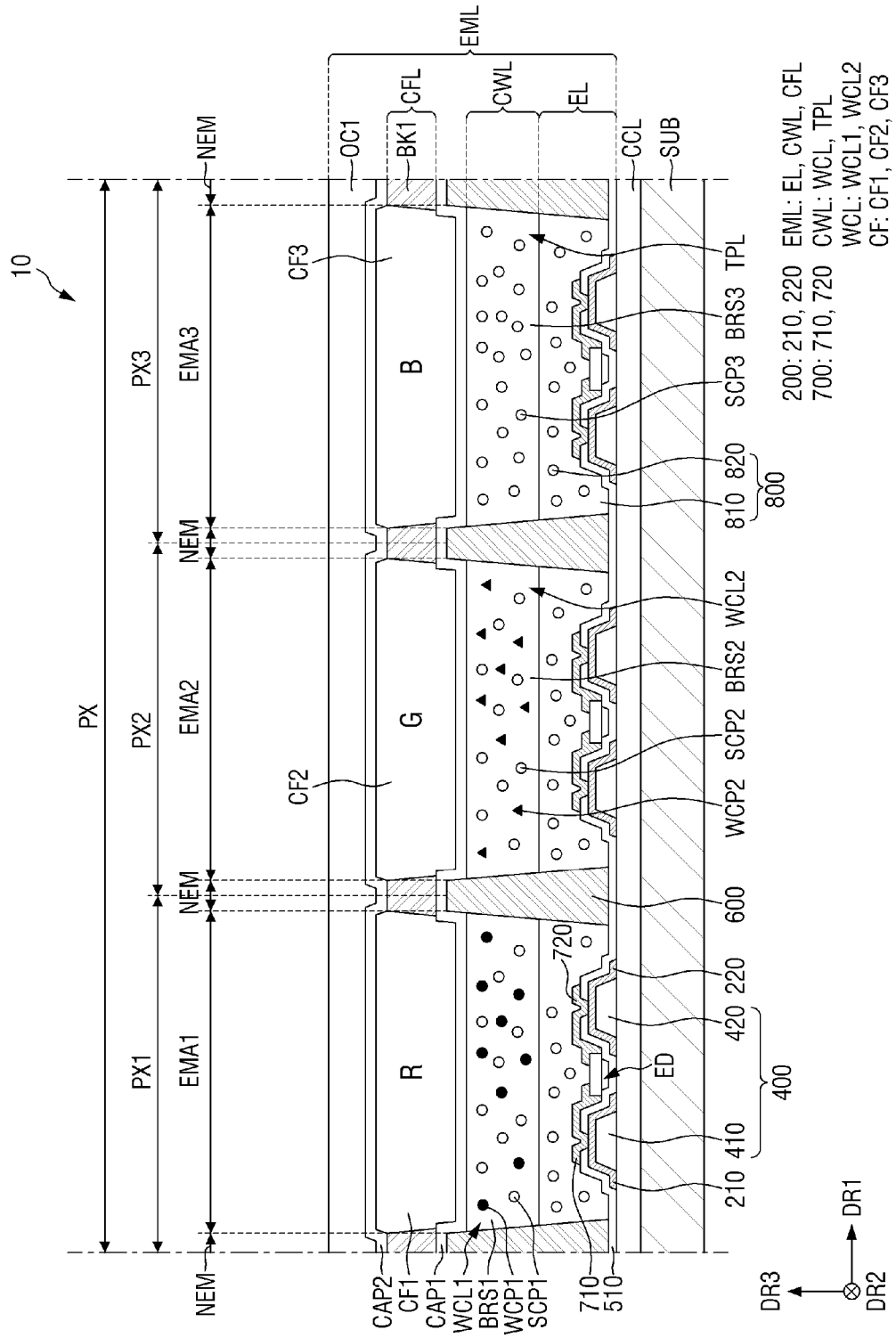
FIG. 3 is a schematic cross-sectional view of a display device according to an embodiment.

FIG. 2 is a schematic cross-sectional view of a display device according to an embodiment. FIG. 3 is a schematic cross-sectional view of a display device according to an embodiment.

Referring to FIGS. 1 to 3, the display area DA of the display device 10 may include pixels PX arranged or disposed in rows and columns, as described above. Each of the pixels PX refers to a repeating minimum unit for displaying images.

In order to display full color, each of the pixels PX may include sub-pixels PXn that emit different colors, where n is a natural number from 1 to 3. For example, each of the pixels PX may include a first sub-pixel PX1 responsible for emitting light of a first color, a second sub-pixel PX2 responsible for emitting light of a second color, and a third sub-pixel PX3 responsible for emitting light of a third color. For example, the first color may be red, the second color may be green, and the third color may be blue. Although a pixel PX may include three sub-pixels PXn in the drawings, the disclosure is not limited thereto. For example, each of the pixels PX may include a greater number of sub-pixels PXn.

Each of the sub-pixels PXn may include an emission area EMA and a non-emission area NEM around it. The emission area EMA may include a first emission area EMA1, a second emission area EMA2, and a third emission area EMA3. The first sub-pixel PX1 may include the first emission area EMA1, the second sub-pixel PX2 may include the second emission area EMA2, and the third sub-pixel PX3 may include the third emission area EMA3.

In the first to third emission areas EMA1, EMA2 and EMA3, light emitted from a display layer EML of the display device 10 to be described later exits. In the non-emission area NEM, no light emitted from the display layer EML is transmitted. The light of the first color may be output from the first emission area EMA1, the light of the second color may be output from the second emission area EMA2, and the light of the third color may be output from the third emission area EMA3. For example, the first color may be red, the second color may be green, and the third color may be blue.

The non-emission area NEM may be disposed to surround the first emission area EMA1, the second emission area EMA2, and the third emission area EMA3. The first emission area EMA1, the second emission area EMA2 and the third emission area EMA3 may be distinguished by the non-emission area NEM.

The display device 10 may include a substrate SUB, a circuit element layer CCL disposed on the substrate SUB, a display layer EML disposed on the circuit element layer CCL, and a touch layer TL disposed on the display layer EML.

The substrate SUB may be a base substrate or a base member and may be made of an insulating material such as a polymer resin. The substrate SUB may be made of an insulating material such as glass, quartz and a polymer resin. The substrate SUB may be either a rigid substrate or a flexible substrate that can be bent, folded, or rolled.

The circuit element layer CCL may be disposed on the substrate SUB. The circuit element layer CCL may be disposed on one surface or a surface of the substrate SUB to drive the pixels PX. The circuit element layer CCL may include at least one transistor or the like to drive a light-emitting element layer EL.

The display layer EML may be disposed on the substrate SUB. The display layer EML may include the light-emitting element layer EL, a wavelength control layer CWL, and a color filter layer CFL.

The light-emitting element layer EL may be disposed on one surface or a surface of the circuit element layer CCL. The light-emitting element layer EL may include pixels each including a first electrode, an emissive layer and a second electrode. In an embodiment, the emissive layer may include an inorganic light-emitting diode. It should be understood that the disclosure is not limited thereto. In embodiments, the emissive layer may include an organic light-emitting diode.

The light-emitting element layer EL may include a first bank 400, a second bank 600, an electrode layer 200, contact electrodes 700, light-emitting diodes ED, a first insulating layer 510 and a scattering layer 800.

The first bank 400 may be disposed on the circuit element layer CCL. The first bank 400 may be disposed in each of the first to third emission areas EMA1, EMA2 and EMA3, which are the emission areas EMA of the first to third sub-pixels PX1, PX2 and PX3, respectively. The first bank 400 disposed in each of the first to third emission areas EMA1, EMA2 and EMA3 may include sub-banks. The sub-banks may be spaced apart from one another. For example, the first bank 400 may include a first sub-bank 410 and a second sub-bank 420 spaced apart from each other.

The electrode layer 200 may be disposed on the first bank 400. The electrode layer 200 may include a first electrode 210 and a second electrode 220 spaced apart from each other. The first electrode 210 may be disposed on the first sub-bank 410, and the second electrode 220 may be disposed on the second sub-bank 420.

The first insulating layer 510 may be disposed on the first and second electrode 210 and 220. The first insulating layer 510 may be disposed on the first electrode 210 and the second electrode 220, and may expose at least parts of the first electrode 210 and the second electrode 220.

The second bank 600 may be disposed on the first insulating layer 510. The second bank 600 may be disposed in the non-emission area NEM along the borders of the first to third sub-pixels PX1, PX2 and PX3. The second bank 600 may include an opening exposing the first bank 400 and the light-emitting diodes ED disposed in each of the first to third emission areas EMA1, EMA2 and EMA3. The opening included in the second bank 600 may also expose some parts of the first electrode 210 and the second electrode 220 disposed in each of the first to third emission areas EMA1, EMA2 and EMA3.

During an inkjet printing process for aligning the light-emitting diodes ED of the process of fabricating the display device 10, the second bank 600 may work as partition walls which prevents that the ink in which the light-emitting diodes ED is dispersed is mixed into the adjacent sub-pixel PXn so that the ink can be ejected into the emission area EMA. The second bank 600 may also work as partition walls forming the wavelength control layer CWL, which will be described later. The scattering layer 800 and the wavelength control layer CWL, which will be described later, may be disposed in the areas defined by the second bank 600.

The second bank 600 may also serve to block light emitted from the light-emitting diodes ED from being mixed into the emission areas EMA of the adjacent sub-pixels PXn. The second bank 600 may include an organic material. The second bank 600 may include a light-absorbing material that absorbs light in the visible wavelength band. For example, the second bank 600 may be made of a material used as a black matrix of the display device 10. The second bank 600 may be a type of light-blocking member. It should be understood that the disclosure is not limited thereto. The second bank 600 may include partition walls including an organic material and a reflective layer disposed on the outer surfaces of the partition walls.

The light-emitting diodes ED may be disposed on the first insulating layer 510 between the first sub-bank 410 and the second sub-bank 420. The light-emitting diodes ED may be disposed between the first electrode 210 and the second electrode and 220 so that their ends are disposed on the first insulating layer 510 between the first electrode 210 and the second electrode 220.

The light-emitting diodes ED may be disposed in the emission areas EMA1, EMA2 and EMA3 of the first to third sub-pixels PX1, PX2 and PX3, respectively. The light-emitting diodes ED may be disposed in each of the sub-pixels PX1, PX2 and PX3. The light-emitting diodes ED may be disposed between the first electrode 210 and the second electrode 220 exposed by the opening defined by the second bank 600.

Each of the light-emitting diodes ED may emit light in a given wavelength band. For example, the light-emitting diodes ED may emit light of the third color or blue light having a peak wavelength in a range of about 480 nm or less, for example about 445 nm to about 480 nm or less. It should be understood that the disclosure is not limited thereto. The light-emitting diodes ED may emit green light or red light.

The contact electrodes 700 may be disposed on the light-emitting diodes ED. The contact electrodes 700 may be in contact with the first and second electrodes 210 and 220 and the light-emitting diodes ED exposed by the first insulating layer 510. The contact electrodes 700 may be in contact with the first and second electrodes 210 and 220 and the light-emitting diodes ED, to electrically connect between them.

The contact electrodes 700 may include a first contact electrode 710 and a second contact electrode 720 spaced apart from each other. The first contact electrode 710 and the second contact electrode 720 may be electrically insulated from each other.

The first contact electrode 710 may be disposed on the first electrode 210, and the second contact electrode 720 may be disposed on the second electrode 220. The first contact electrode 710 may electrically connect the first electrode 210 with first ends of the light-emitting diodes ED. The first contact electrode 710 may be in contact with a part of the first electrode 210 that is exposed by the first insulating layer 510 and the first ends of the light-emitting diodes ED. The second contact electrode 720 may electrically connect the second electrode 220 with second ends of the light-emitting diodes ED. The second contact electrode 720 may be in contact with a part of the second electrode 220 that is exposed by the first insulating layer 510 and the second ends of the light-emitting diodes ED. The first ends of the light-emitting diodes ED may be electrically connected to the first electrode 210 through the first contact electrode 710, and the second ends of the light-emitting diodes ED may be electrically connected to the second electrode 220 through the second contact electrode 720.

The scattering layer 800 may be disposed on the contact electrodes 700. The scattering layer 800 may be disposed over the contact electrodes 700 to cover or overlap elements disposed thereunder.

The scattering layer 800 may be disposed in the area defined by the second bank 600. The scattering layer 800 may be disposed separately in each of the first to third sub-pixels PX1, PX2 and PX3. The scattering layer 800 may be disposed in each of the emission areas EMA1, EMA2 and EMA3 of the first to third sub-pixels PX1, PX2 and PX3, respectively, and the scattering layer 800 may be spaced apart from another one by the second bank 600.

The area defined by the second bank 600 may be filled with the scattering layer 800. The scattering layer 800 may be disposed over the light-emitting diodes ED to cover or overlap the light-emitting diodes ED.

The scattering layer 800 may include a binder layer 810 and light-scattering particles 820 dispersed in the binder layer 810. The scattering layer 800 may be disposed in each of the first to third emission areas EMA1, EMA2 and EMA3, and may be interposed between the wavelength control layer CWL and the light-emitting diodes ED, which will be described later. The scattering layer 800 may include the light-scattering particles 820 and may be disposed between the wavelength control layer CWL and the light-emitting diodes ED to disperse the lights emitted from the light-emitting diodes ED so that the lights are not concentrated. The scattering layer 800 may disperse the lights emitted from the light-emitting diodes ED and incident on the wavelength control layer CWL, so that the lights emitted from the light-emitting diodes ED are incident on the wavelength control layer CWL with a uniform luminance when viewed from the top.

The wavelength control layer CWL may be disposed on the light-emitting element layer EL. The wavelength control layer CWL may transmit the lights emitted from the light-emitting element layer EL and incident on the wavelength control layer CWL with or without changing the wavelength.

The wavelength control layer CWL may be disposed above the light-emitting diodes ED. The wavelength control layer CWL may overlap the light-emitting diodes ED in the third direction DR3. The wavelength control layer CWL may be disposed above the light-emitting diodes ED and may transmit the lights emitted from the light-emitting diodes ED and incident on the wavelength control layer CWL with or without changing the wavelength.

The scattering layer 800 may be disposed between the wavelength control layer CWL and the light-emitting diodes ED. The wavelength control layer CWL may be disposed on the scattering layer 800 to be in contact with one surface or a surface of the scattering layer 800. The wavelength control layer CWL may be disposed in the opening defined by the second bank 600. The wavelength control layer CWL may be disposed on the scattering layer 800 in the opening.

The wavelength control layer CWL may include wavelength conversion layers WCL that convert the wavelengths of light incident on the wavelength control layer CWL, and a transparent pattern TPL that transmits light incident on the wavelength control layer CWL without changing the wavelength of the light.

The wavelength conversion layer WCL or the transparent pattern TPL may be disposed separately in each of the first to third sub-pixels PX1, PX2 and PX3. The wavelength conversion layers WCL or the transparent pattern TPL may be disposed in each of the emission areas EMA1, EMA2 and EMA3 of the first to third sub-pixels PX1, PX2 and PX3, respectively. Each of the wavelength conversion layers WCL and/or the transparent pattern TPL may be spaced apart from another adjacent one by the second bank 600 disposed in the non-emission area NEM.

The wavelength conversion layers WCL may be disposed in a sub-pixel in which lights incident from the light-emitting element layer EL may include a light of a color different from the color of the sub-pixel and this it is necessary to convert the wavelength of the light incident from the light-emitting element layer EL. The transparent pattern TPL may be disposed in a sub-pixel in which light incident from the light-emitting element layer EL has the same color as the color of the sub-pixel. According to an embodiment, the wavelength conversion layer WCL may be disposed on each of the first sub-pixel PX1 and the second sub-pixel PX2, and the transparent pattern TPL may be disposed on the third sub-pixel PX3, respectively.

The wavelength conversion layers WCL may include a first wavelength conversion pattern WCL1 disposed in the first sub-pixel PX1, and a second wavelength conversion pattern WCL2 disposed in the second sub-pixel PX2.

The first wavelength conversion pattern WCL1 may be disposed in the first emission area EMA1 defined by the second bank 600 in the first sub-pixel PX1. The first wavelength conversion pattern WCL1 may be disposed on the scattering layer 800 in the first emission area EMA1 defined by the second bank 600. The first wavelength conversion pattern WCL1 may be in contact with one surface or a surface of the scattering layer 800 disposed in the first emission area EMA1. The scattering layer 800 may be disposed between the light-emitting diodes ED and the first wavelength conversion pattern WCL1 in the first emission area EMA1.

The first wavelength conversion pattern WCL1 may convert light incident from the light-emitting element layer EL into light of the first color and output it. The first wavelength conversion pattern WCL1 may convert light incident from the light-emitting element layer EL into blue light to output it.

The first wavelength conversion pattern WCL1 may include a first base resin BRS1, and first wavelength-converting particles WCP1 dispersed in the first base resin BRS1. The first wavelength conversion pattern WCL1 may further include first scattering particles SCP1 dispersed in the first base resin BRS1.

The second wavelength conversion pattern WCL2 may be disposed in the second emission area EMA2 defined by the second bank 600 in the second sub-pixel PX2. The second wavelength conversion pattern WCL2 may be disposed on the scattering layer 800 in the s e emission area EMA2 defined by the second bank 600. The second wavelength conversion pattern WCL2 may be in contact with one surface or a surface of the scattering layer 800 disposed in the second emission area EMA2. The scattering layer 800 may be disposed between the light-emitting diodes ED and the second wavelength conversion pattern WCL2 in the second emission area EMA2.

The second wavelength conversion pattern WCL2 may convert light incident from the light-emitting element layer EL into light of the second color and output it. The second wavelength conversion pattern WCL2 may convert light incident from the light-emitting element layer EL into blue light to output it.

The second wavelength conversion pattern WCL2 may include a second base resin BRS2 and second wavelength-converting particles WCP2 dispersed in the second base resin BRS2. The second wavelength conversion pattern WCL2 may further include second scattering particles SCP2 dispersed in the second base resin BRS2.

The transparent pattern TPL may be disposed in the third emission area EMA3 defined by the second bank in the third sub-pixel PX3. The transparent pattern TPL may be disposed on the scattering layer 800 in the third emission area EMA3 defined by the second bank 600. The transparent pattern TPL may be in contact with the scattering layer 800 disposed in the third emission area EMA3. The scattering layer 800 may be disposed between the light-emitting diodes ED and the transparent pattern TPL in the third emission area EMA3.

The transparent pattern TPL may output the light incident from the light-emitting element layer EL without changing its wavelength. The transparent pattern TPL may output the light incident from the light-emitting element layer EL without changing its wavelength as blue light.

The transparent pattern TPL may include a third base resin BRS3. The transparent pattern TPL may further include third scattering particles SCP3 dispersed in the third base resin BRS3.

The first to third base resins BRS1, BRS2 and BRS3 may include a transparent organic material. For example, the first to third base resins BRS1, BRS2 and BRS3 may include an epoxy resin, an acrylic resin, a cardo resin, an imide resin, or the like within the spirit and the scope of the disclosure. The first to third base resins BRS1, BRS2 and BRS3 may be made of, but is not limited to, a same material or a similar material.

The first to third scattering particles SCP1, SCP2 and SCP3 may have refractive indexes different from those of the first to third base resins BRS1, BRS2 and BRS3. The first to third scattering particles SCP1, SCP2 and SCP3 may include metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc., within the spirit and the scope of the disclosure. Examples of the material of the organic particles may include an acrylic resin, a urethane resin, etc., within the spirit and the scope of the disclosure. The first to third scattering particles SCP1, SCP2 and SCP3 may be made of, but is not limited to, a same material or a similar material.

The first wavelength-converting particles WCP1 may convert the light of the third color or the light of the second color into the light of the first color, and the second wavelength-converting particles WCP2 may convert the light of the third color into the light of the second color. For example, the first wavelength-converting particles WCP1 may be a material that converts blue light into red light, or a material that converts green light into red light. The second wavelength-converting particles WCP2 may be a material that converts blue light into green light The first wave-converting particles WCP1 and the second wavelength-converting particles WCP2 may be quantum dots (QD), quantum bars, fluorescent material, or phosphorescent material. The quantum dots may include IV nanocrystals, II-VI compound nanocrystals, III-V compound nanocrystals, IV-VI nanocrystals, or combinations thereof.

A quantum dot may include a core and a shell overcoating the core. The core may be, but not limited to, at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, Fe2O3, Fe3O4, Si and Ge. The shell may include, but not limited to, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe.

As the fluorescent material, inorganic fluorescent materials such as garnets, silicates, sulfides, oxynitrides, nitrides and aluminates may be used as an inorganic fluorescent material. The inorganic fluorescent material may include, but not limited to, at least one of: $Y_3Al_5O_{12}:Ce^{3+}$ (YAG:Ce), $Tb_3Al_5O_{12}:Ce^{3+}$ (TAG:Ce), $(Sr,Ba,Ca)_2SiO_4:Eu^{2+}$, (Sr, Ba,Ca,Mg,Zn)$_2$Si(OD)$_4$:Eu$^{2+}$ D=F, Cl, S, N, Br, $Ba_2MgSi_2O_7:Eu^{2+}$, $Ba_2SiO_4:Eu^{2+}$, $Ca_3(Sc,Mg)_2Si_3O_{12}:Ce^{3+}$, $(Ca, Sr)S:Eu^{2+}$, $(Sr,Ca)Ga_2S_4:Eu^{2+}$, $SrSi_2O_2N_2:Eu^{2+}$, $SiAlON:Ce^{3+}$, $\beta$-SiAlON:Eu$^{2+}$, Ca-$\alpha$-SiAlON:Eu$^{2+}$, $Ba_3Si_6O_{12}N_2:Eu^{2+}$, $CaAlSiN_3:Eu^{2+}$, $(Sr,Ca)AlSiN_3:Eu^{2+}$, $Sr_2Si_5N_8:Eu^{2+}$, $(Sr,Ba)Al_2O_4:Eu^{2+}$, $(Mg,Sr)Al_2O_4:Eu^{2+}$, $BaMg_2Al_{16}O_{27}:Eu^{2+}$. It should be understood that the disclosure is not limited thereto. The fluorescent material may include an organic fluorescent material. The fluorescent material may have a content range of about 5 to about 99% by weight of the total solids in the base resin.

The scattering layer 800 disposed in each of the sub-pixels PXn may be interposed between the wavelength control layer CWL and the light-emitting diodes ED disposed in each of the sub-pixels PXn. The scattering layer 800 disposed in the first sub-pixel PX1 may be disposed between the first wavelength conversion pattern WCL1 and the light-emitting diodes ED disposed in the first emission area EMA1, the scattering layer 800 disposed in the second sub-pixel PX2 may be disposed between the second wavelength conversion pattern WCL2 and the light-emitting diodes ED disposed in the second emission area EMA2, and The scattering layer 800 disposed in the third sub-pixel PX3 may be disposed between the transparent pattern TPL and the light-emitting diodes ED disposed in the third emission area EMA3. The scattering layer 800 and the wavelength control layer CWL disposed in each of the first to third emission areas EMA1, EMA2 and EMA3 may be spaced apart from another one, with the second bank 600 therebetween.

The display layer EML may further include a first capping layer CAP1. The first capping layer CAP1 may be disposed on the wavelength control layer CWL and the second bank 600 to cover or overlap them. For example, the first capping layer CAP1 may encapsulate the first wavelength conversion pattern WCL1, the second wavelength conversion pattern WCL2, the transparent pattern TPL and a first light-blocking member BK1, to prevent damage or contamination to the first wavelength conversion pattern WCL1, the second wavelength conversion pattern WCL2 and the transparent pattern TPL.

The first capping layer CAP1 may include an inorganic material. For example, the first capping layer CAP1 may include at least one of: silicon nitride, aluminum nitride, zirconium nitride, titanium nitride, hafnium nitride, tantalum nitride, silicon oxide, aluminum oxide, titanium oxide, tin oxide, cerium oxide and silicon oxynitride. Although the first capping layer CAP1 is made up of a single layer in the drawings, the disclosure is not limited thereto. For example, the first capping layer CAP1 may be made up of multiple layers in which inorganic layers including at least one of the materials listed above as materials that can be included by the first capping layer CAP1 may be alternately stacked each other. The thickness of the first capping layer CAP1 may be in a range of, but is not limited to, about 0.05 μm to about 2 μm.

The color filter layer CFL may be disposed on the first capping layer CAP1 in the display area DA. The color filter layer CFL may include the first light-blocking member BK1 and color filters CF disposed in the space defined by the first light-blocking member BK1.

The first light-blocking member BK1 may be disposed on the first capping layer CAP1. The first light-blocking member BK1 may be disposed on the first capping layer CAP1 in the non-emission area NEM along the boundaries of the first to third sub-pixels PX1, PX2 and PX3. The first light-blocking member BK1 may overlap the second bank 600 in the thickness direction of the display device 10 (for example, in the third direction DR3).

The first light-blocking member BK1 may not only block emission of light but also suppress reflection of external light. The first light-blocking member BK1 may be formed in a substantially lattice shape surrounding the first to third emission areas EMA1, EMA2 and EMA3 when viewed from the top.

The first light-blocking member BK1 may be made of a material including an organic material. According to an embodiment, the first light-blocking member BK1 may include a light-absorbing material that absorbs light in the visible wavelength range. As the first light-blocking member BK1 may include a light-absorbing material and is disposed along the boundaries of the first to third sub-pixels PX1, PX2 and PX3, the first light-blocking member BK1 may define first to third emission areas EMA1, EMA2 and EMA3.

The color filters CF may include a first color filter CF1, a second color filter CF2 and a third color filter CF3.

The first color filter CF1 may be disposed in the first emission area EMA1 of the first sub-pixel PX1, the second color filter CF2 may be disposed in the second emission area EMA2 of the second sub-pixel PX2, and the third color filter CF3 may be disposed in the third emission area EMA3 of the third sub-pixel PX3. The first to third color filters CF1, CF3 and CF3 may be surrounded by the first light-blocking member BK1.

The first to third color filters CF1, CF2 and CF3 may include a colorant such as a dye and a pigment that absorbs wavelengths other than a given color wavelength. The first color filter CF1 may selectively transmit light of the first color (for example, red light) and may block and absorb light of the second color (for example, green light) and light of the third color (for example, blue light). The second color filter CF2 may selectively transmit light of the second color (for example, green light) and may block and absorb light of the first color (for example, red light) and light of the third color (for example, blue light). The third color filter CF3 may selectively transmit light of the third color (for example, blue light) and may block and absorb light of the first color (for example, red light) and light of the second color (for example, green light). For example, the first color filter CF1 may be a red color filter R, the second color filter CF2 may be a green color filter G, and the third color filter CF3 may be a blue color filter B.

The first to third color filters CF1, CF2 and CF3 may absorb a part of the light introduced from the outside of the display device 10 to reduce reflection of external light. Accordingly, the first to third color filters CF1, CF2 and CF3 can prevent color distortion due to reflection of external light.

The color filters CF are disposed on the first and second wavelength conversion patterns WCL1 and WCL2 and the transparent pattern TPL, and thus the display device 10 requires no additional substrate for the color filters CF. Therefore, the thickness of the display device 10 can be relatively reduced.

A second capping layer CAP2 may be disposed on the color filter layer CF. The second capping layer CAP2 may be disposed on the first to third color filters CF1, CF2 and CF3 and the first light-blocking member BK1 to cover or overlap them. The second capping layer CAP2 may serve to protect the color filter layer CFL.

A protection layer OC1 may be disposed on the color filter layer CFL. The protection layer OC1 may serve to prevent permeation of oxygen or moisture into the wavelength control layer CWL and the light-emitting element layer EL disposed thereunder. To this end, the protection layer OC1 may include at least one inorganic film. The protection layer OC1 may be disposed to cover or overlap the color filter layer CFL, the wavelength control layer CWL, the light-emitting element layer EL, and the circuit element layer CCL disposed thereunder.

The touch layer TL may be disposed on the display layer EML. The touch layer TL may be disposed on or directly disposed on the display layer EML. The touch layer TL may detect the location of a touch input from the outside. The touch layer TL may be of a rigid panel type, a flexible panel type, or a film type. It is, however, to be understood that the disclosure is not limited thereto. In some implementations, the touch layer TL may be eliminated.

Figure 4:
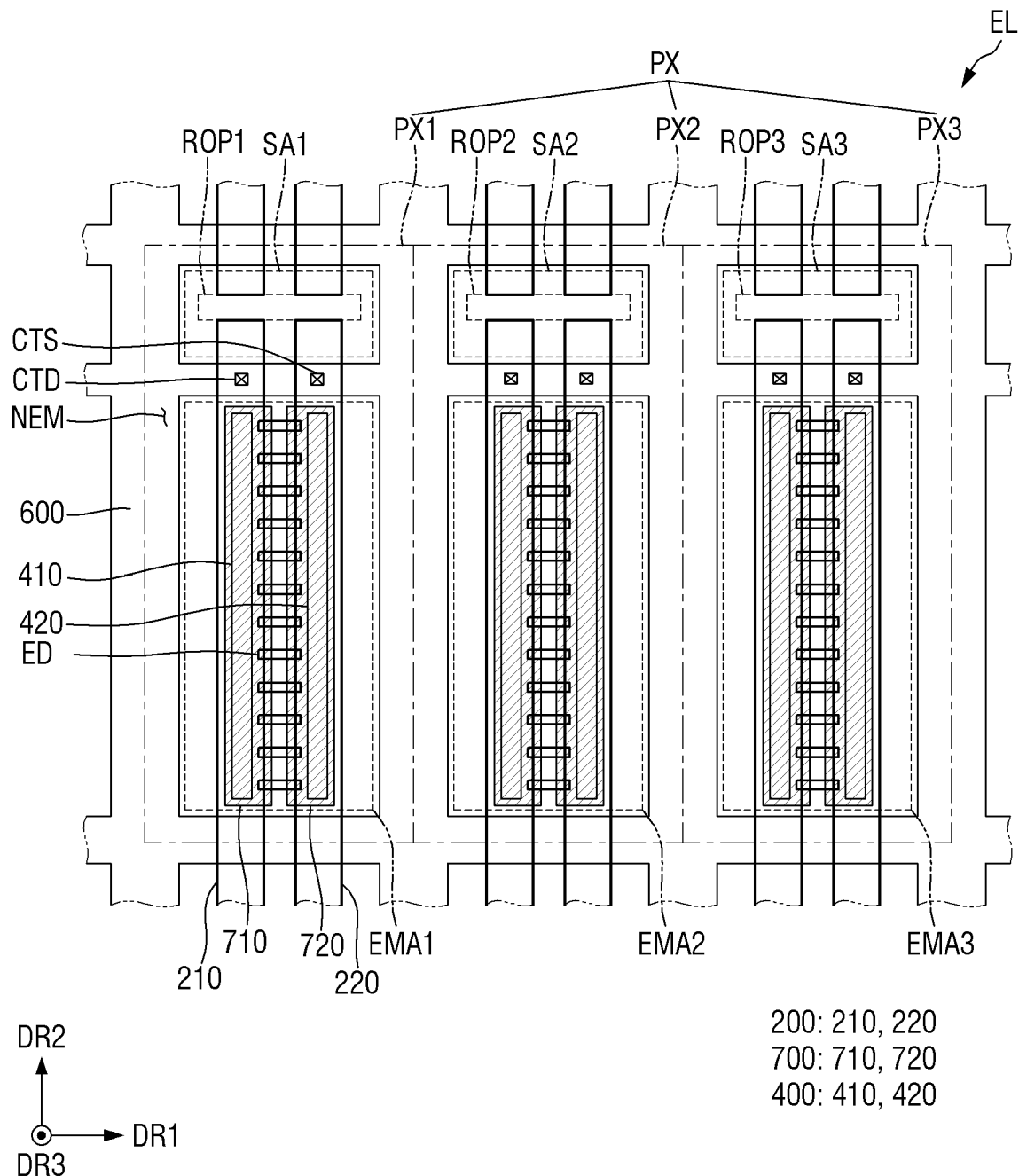
FIG. 4 is a schematic plan view showing a layout of a light-emitting element layer according to an embodiment.

FIG. 4 is a schematic plan view showing a layout of a light-emitting element layer according to an embodiment.

Referring to FIG. 4, the first to third sub-pixels PX1, PX2 and PX3 may have a same structure of the light-emitting element layer EL. Accordingly, in the following description of the light-emitting element layer EL, the description of the structure of the second and third sub-pixels PX2 and PX3 will be replaced with the description of the structure of the first sub-pixel PX1.

The first sub-pixel PX1 of the light-emitting element layer EL may include the first emission area EMA1 and the non-emission area NEM, the second sub-pixel PX2 of the light-emitting element layer EL may include the second emission area EMA2 and the non-emission area NEM, and the third sub-pixel PX3 of the light-emitting element layer EL may include the third emission area EMA3 and the non-emission area NEM. In the first to third emission areas EMA1, EMA2 and EMA3, light emitted from the light-emitting diodes ED may exit. In the non-emission area NEM, light emitted from the light-emitting diodes ED do not reach and thus no light exits therefrom.

Each of the first to third emission area EMA1, EMA2 and EMA3 may include an area in which the light-emitting diodes ED are disposed and the periphery. Each of the first to third emission areas EMA1, EMA2 and EMA3 may further include an area in which light emitted from the light-emitting diodes ED is reflected or refracted by other elements to exit.

The sub-pixels PXn may further include subsidiary areas SAn disposed in the non-emission area NEM, respectively, where n is a natural number of 1 to 3. The first sub-pixel PX1 may include a first subsidiary area SA1 disposed in the non-emission area NEM, the second sub-pixel PX2 may include a second subsidiary area SA2 disposed in the non-emission area NEM, and the third sub-pixel PX3 may include a third subsidiary area SA3 disposed in the non-emission area NEM.

No light-emitting diodes ED may be disposed in the subsidiary areas SAn. The subsidiary areas SAn may be disposed on the upper side of the emission areas EMAn (or one side or a side in the second direction DR2) in the sub-pixels PXn, respectively. For example, the first subsidiary area SA1 may be disposed on the upper side of the first emission area EMA1 in the first sub-pixel PX1, the second subsidiary area SA2 may be disposed on the upper side of the second emission area EMA2, and the third subsidiary area SA3 may be disposed on the upper side of the third emission area EMA3 in the third sub pixel PX3. Each of the subsidiary areas SAn may be disposed between the emission areas EMAn of the sub-pixels PXn adjacent to each other in the second direction DR2.

The subsidiary areas SAn may include separation regions ROPn, respectively. The separation regions ROPn may include a first separation region ROP1, a second separation region ROP2, and a third separation region ROP3. For example, the first subsidiary area SA1 may include the first separation region ROP1, the second subsidiary area SA2 may include the second separation region ROP2, and the third subsidiary area SA3 may include the third separation region ROP3. In each of the separation regions ROPn of the subsidiary areas SAn, a first electrode 210 and a second electrode 220 included the electrode layer 200 in a sub-pixel PXn may be separated from a first electrode 210 and a second electrode 220 in another sub-pixel PXn adjacent to the sub-pixel PXn in the second direction DR2, respectively.

Figure 5:
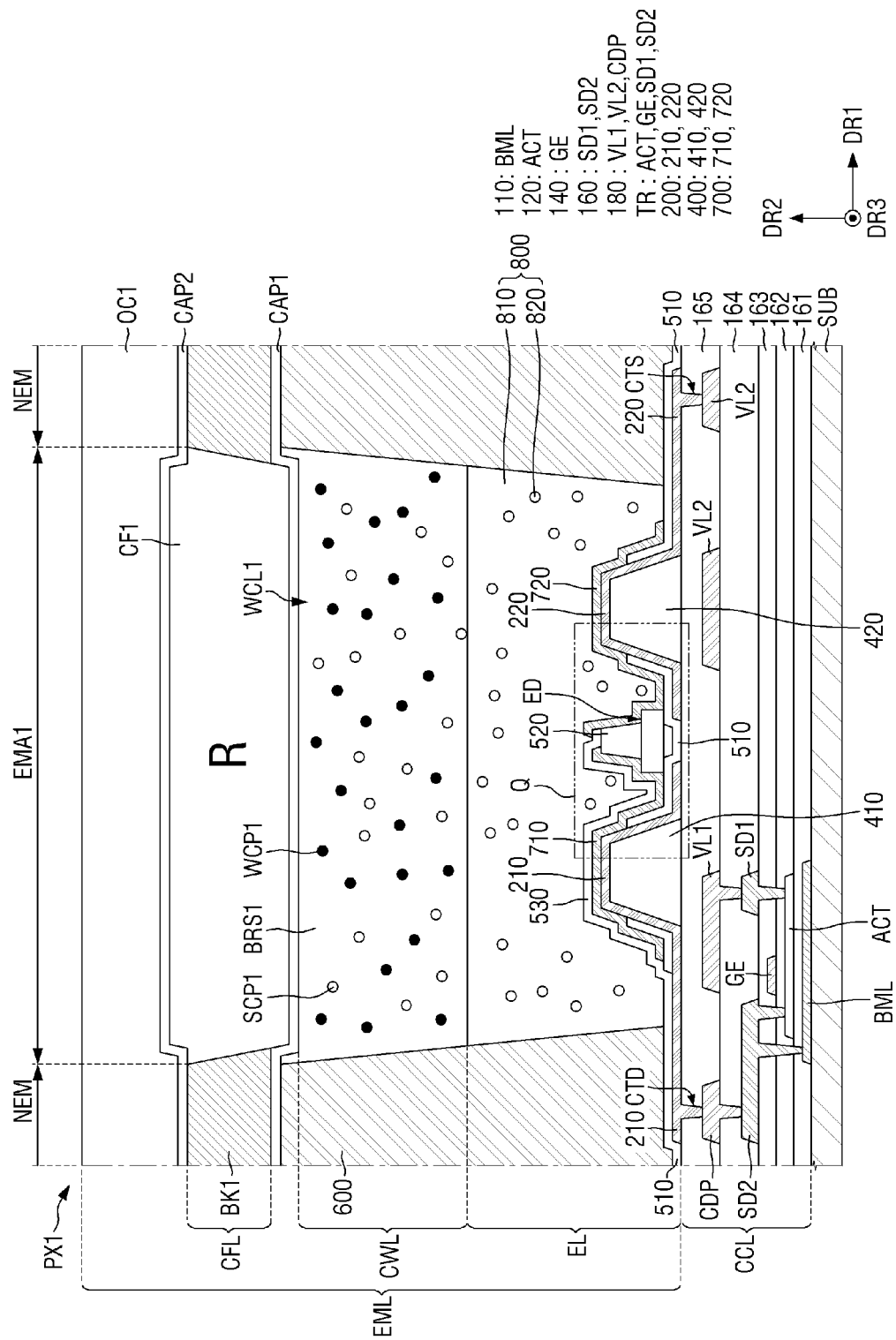
FIG. 5 is a schematic cross-sectional view showing an example of the first emission area of the first sub-pixel included in the display device of FIG. 3.
Figure 6:
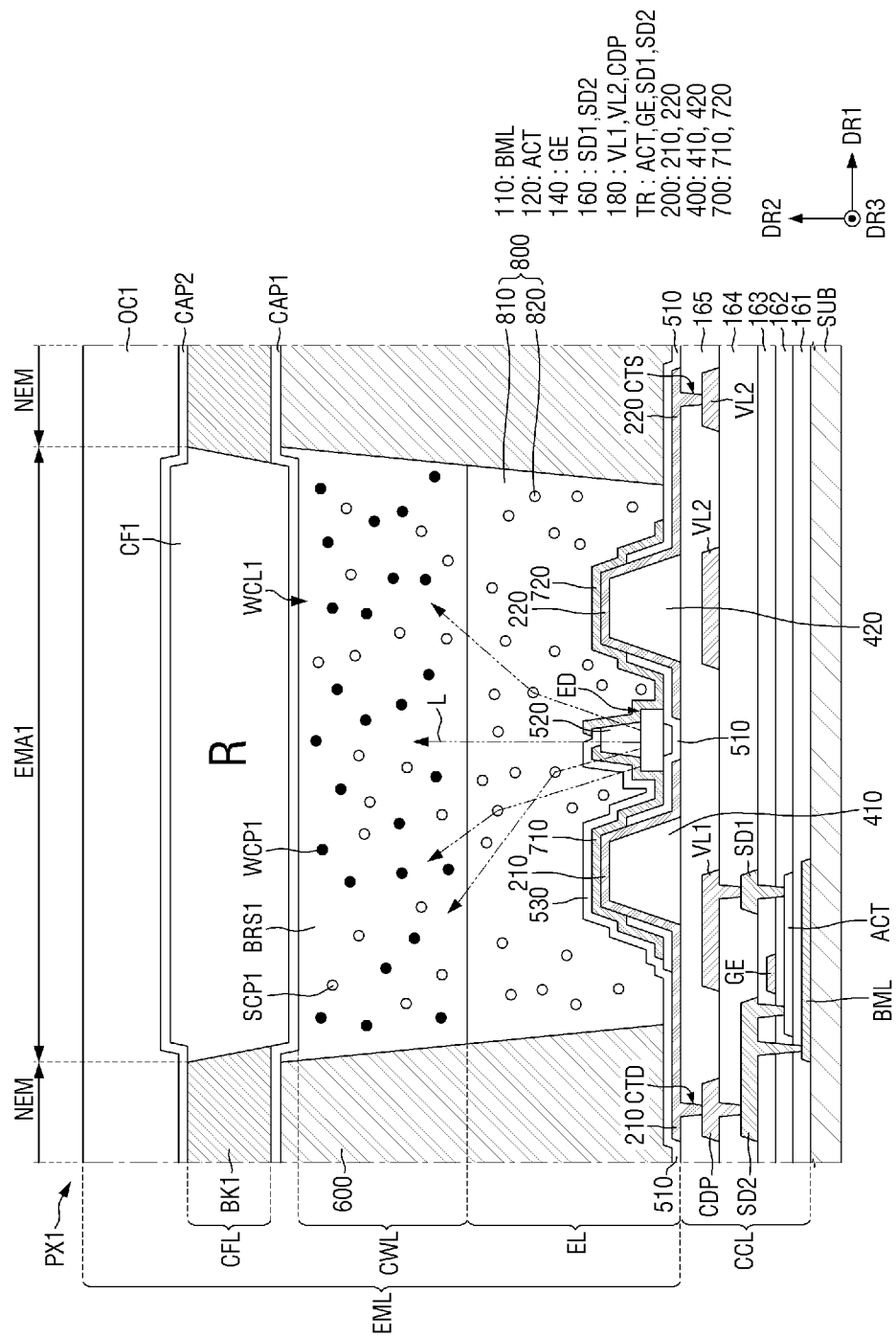
FIG. 6 is a schematic cross-sectional view showing paths of light emitted from a light-emitting diode of a display device according to an embodiment.

FIG. 5 is a schematic cross-sectional view showing an example of the first emission area of the first sub-pixel included in the display device of FIG. 3. FIG. 6 is a schematic cross-sectional view showing paths of light emitted from a light-emitting diode of a display device according to an embodiment.

Hereinafter, a structure of the circuit element layer CCL disposed on the substrate SUB will be described with reference to FIG. 5. It should be noted that FIG. 5 shows only the cross-sectional structure of the first sub-pixel PX1.

The circuit layer CCL may include a bottom metal layer 110, a buffer layer 161, first to third conductive layers 140, 160 and 180, a semiconductor layer 120, a gate insulator 162, an interlayer dielectric film 163, a passivation layer 164, and a via layer 165.

The bottom metal layer 110 may be disposed on the substrate SUB. The bottom metal layer 110 may include a metal pattern BML. The metal pattern BML, may be a light-blocking layer that protects the active material layer ACT of the transistor TR from external light. The bottom metal layer 110 may include a material that blocks light. For example, the bottom metal layer 110 may be made of an opaque metal material that blocks light transmission.

The metal pattern BML may be disposed under or below and may cover or overlap at least a channel region of the active material layer ACT of the transistor TR, and may further cover or overlap the entire active material layer ACT of the transistor TR. It is, however, to be understood that the disclosure is not limited thereto. The metal pattern BML may be eliminated.

A buffer layer 161 may be disposed over the bottom metal layer 110. The buffer layer 161 may be disposed to cover or overlap the entire surface of the substrate SUB on which the bottom metal layer 110 is disposed. The buffer layer 161 can protect the transistor R from moisture permeating through the substrate SUB which is vulnerable to moisture permeation. The buffer layer 161 may be formed of inorganic layers alternately stacked each other. For example, the buffer layer 161 may be made up of multiple layers in which inorganic layers including at least one of a silicon oxide ($SiO_x$), a silicon nitride ($SiN_x$) and silicon oxynitride ($SiO_xN_y$) may be alternately stacked each other.

The semiconductor layer 120 may be disposed on the buffer layer 161. The semiconductor layer 120 may include the active material layer ACT of the transistor TR. The active material layer ACT may be disposed to overlap the metal pattern BML, of the bottom metal layer 110.

Although only one transistor TR among the transistors included in the first sub-pixel PX1 of the display device 10 is depicted in the drawing, the disclosure is not limited thereto. The first sub-pixel PX1 of the display device 10 may include a larger number of transistors. For example, the first sub-pixel PX1 of the display device 10 may include two or three transistors in each of the pixels PX.

The semiconductor layer 120 may include polycrystalline silicon, monocrystalline silicon, an oxide semiconductor, etc., within the spirit and the scope of the disclosure. According to an embodiment, in case that the semiconductor layer 120 may include polycrystalline silicon, the polycrystalline silicon may be formed by crystallizing amorphous silicon. In case that the semiconductor layer 120 contains polycrystalline silicon, the active material layer ACT may include doped regions doped with impurities, and a channel region between them. In an embodiment, the semiconductor layer 120 may include an oxide semiconductor. For example, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), etc., within the spirit and the scope of the disclosure.

The gate insulator 162 may be disposed on the semiconductor layer 120. The gate insulator 162 may work as a gate insulating layer of the transistor TR. The gate insulator 162 may be made up of an inorganic layer including an inorganic material, such as silicon oxide ($SiO_x$), silicon nitride ($SiN_x$) and silicon oxynitride ($SiO_xN_y$), or may be formed as a stack of such materials.

The first conductive layer 140 may be disposed on the gate insulator 162. The first conductive layer 140 may include the gate electrode GE of the transistor TR. The gate electrode GE may be disposed so that it overlaps the channel region of the active material layer ACT in the thickness direction, for example, the third direction DR3.

The first conductive layer 140 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The interlayer dielectric film 163 may be disposed on the first conductive layer 140. The interlayer dielectric film 163 may be disposed to cover or overlap the first conductive layer 140 and may work as an insulating film between the first conductive layer 140 and other layers disposed thereon. The interlayer dielectric film 163 may be made up of multiple layers in which inorganic layers including inorganic insulating material, for example, at least one of silicon oxide ($SiO_x$), silicon nitride ($SiN_x$) and silicon oxynitride ($SiO_xN_y$) may be alternately stacked each other.

A second conductive layer 160 is disposed on the interlayer dielectric film 163. The second conductive layer 160 may include a drain electrode SD1 of the transistor TR and a source electrode SD2 of the transistor TR.

The drain electrode SD1 and the source electrode SD2 of the transistor TR may be electrically connected to both end regions of the active material layer ACT of the transistor TR (for example, doped regions of the active material layer ACT of the transistor TR), respectively, through contact holes penetrating through the interlayer dielectric film 163 and the gate insulator 162. The source electrode SD2 of the transistor TR may be electrically connected to the bottom metal layer 110 through another contact hole penetrating through the interlayer dielectric film 163, the gate insulator 162, and the buffer layer 161.

The second conductive layer 160 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The passivation layer 164 is disposed on the second conductive layer 160. The passivation layer 164 covers or overlaps and protects the second conductive layer 160. The passivation layer 164 may be made up of multiple layers in which inorganic layers including inorganic insulating material, for example, at least one of silicon oxide ($SiO_x$), silicon nitride ($SiN_x$) and silicon oxynitride ($SiO_xN_y$) may be alternately stacked each other.

The third conductive layer 180 is disposed on the passivation layer 164. The third conductive layer 180 may include a first voltage line VL1, a second voltage line VL2, and a first conductive pattern CDP.

A high-level voltage (or first supply voltage) to be supplied to the transistor TR may be applied to the first voltage line VL1, and a low-level voltage (or second supply voltage) which is lower than the high-level voltage (the first supply voltage) supplied to the first voltage line VL1 may be applied to the second voltage line VL2.

The first voltage line VL1 may be electrically connected to the transistor TR to supply the high-level voltage (the first supply voltage) to the transistor TR. The first voltage line VL1 may be electrically connected to the drain electrode SD1 of the transistor TR through a contact hole penetrating through the passivation layer 164.

The second voltage line VL2 may be electrically connected to the second electrode 220 to apply the low-level voltage (second supply voltage) to the second electrode 220. An alignment signal necessary for aligning the light-emitting diodes ED during the process of fabricating the display device 10 may be applied to the second voltage line VL2.

The first conductive pattern CDP may be electrically connected to the source electrode SD2 of the transistor TR through a contact hole penetrating through the passivation layer 164. The first conductive pattern CDP may be electrically connected to the first electrode 210. The first conductive pattern CDP may transfer the first supply voltage applied from the first voltage line VL1 to the first electrode 210.

The third conductive layer 180 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The via layer 165 is disposed on the third conductive layer 180. The via layer 165 may be disposed on the passivation layer 164 on which the third conductive layer 180 is disposed. The via layer 165 may provide a flat surface. The via layer 165 may include an organic insulating material, for example, an organic material such as polyimide (PI).

Referring to FIGS. 4 and 5, the light-emitting element layer EL may be disposed on the via layer 165. The light-emitting element layer EL may include the electrode layer 200, the first bank 400, the second bank 600, light-emitting diodes ED, the contact electrode 700, insulating layers 510, 520 and 530, the scattering layer 800.

The first bank 400 is disposed on the via layer 165. The first bank 400 may be disposed on or directly disposed on the upper surface of the via layer 165. The first bank 400 may be disposed in the emission area EMA.

The first bank 400 may have a shape extended in the second direction DR2 in the emission area EMA. The length of the first bank 400 in the second direction DR2 may be smaller than the length of the emission area EMA surrounded by the second bank 600 in the second direction DR2.

The first bank 400 may include sub-banks 410 and 420 spaced apart from each other in the emission area EMA. The sub-banks 410 and 420 may have a shape extended in the second direction DR2 and may be spaced apart from one another in the first direction DR1. According to an embodiment, the first bank 400 may include the first sub-bank 410 and the second sub-bank 420. The first sub-bank 410 may be disposed on the left side in the emission area EMA when viewed from the top. The second sub-bank 420 may be spaced apart from the first sub-bank 410 in the first direction DR1 to be disposed on the right side in the emission area EMA when viewed from the top. Light-emitting diodes ED may be disposed between the sub-banks 410 and 420 spaced apart from each other.

As the first bank 400 may include the inclined side surfaces, the light that is emitted from the light-emitting diodes ED and travels toward the side surfaces of the first bank 400 can be guided toward the upper side (for example, display side). The first bank 400 may provide the space where the light-emitting diodes ED are disposed and may also work as reflective partition walls that changes the traveling direction of light emitted from the light-emitting diodes ED toward the display side.

Although the side surfaces of the first bank 400 have a substantially inclined linear shape in the drawings, the disclosure is not limited thereto. For example, the side surfaces (or outer surfaces) of the first bank 400 may have a shape of a substantially curved semi-circle or substantially semi-ellipse. According to an embodiment, the first bank 400 may include, but is not limited to, an organic insulating material such as polyimide (PI).

The electrode layer 200 may be disposed on the first bank 400 and the via layer 165 exposed by the first bank 400. The electrode layer 200 may have a shape extended in a direction and may be disposed in each of the sub-pixels PXn. The electrode layer 200 may be extended in the second direction DR2 and may be disposed across the emission area EMA and the subsidiary areas SAn of the sub-pixels PXn. The electrode layer 200 may be disposed on the first bank 400 and the via layer 165 exposed by the first bank 400 in the emission area EMA, and on the via layer 165 in the non-emission area NEM.

The electrode layer 200 may include electrodes. The electrodes have a shape extended in the second direction DR2 and are spaced apart from one another in the first direction DR1. The electrode layer 200 may include a first electrode 210 and a second electrode 220 spaced apart from each other. At least a part of the first electrode 210 and the second electrode 220 may be disposed in the emission area EMA. As will be described later, at least a part of the first electrode 210 and the second electrode 220 in the emission area EMA may be exposed by the second bank 600.

The first electrode 210 may be disposed on the first sub-bank 410 in the emission area EMA, and the second electrode 220 may be disposed on the second sub-bank 420 in the emission area EMA. The first electrode 210 and the second electrode 220 may be disposed on at least inclined side surfaces of the first sub-bank 410 and the second sub-bank 420, respectively. The first and second electrodes 210 and 220 may be disposed to cover or overlap at least the side surfaces of the first and second sub-banks 410 and 420 facing each other, respectively, to reflect light emitted from the light-emitting diodes ED.

The first electrode 210 may be electrically connected to a first conductive pattern CDP through a first electrode contact hole CTD penetrating the via layer 165. The first electrode 210 may be in contact with the upper surface of the first conductive pattern CDP exposed by the first electrode contact hole CTD. The first electrode 210 may be electrically connected to the transistor TR through the first conductive pattern CDP. Although the first electrode contact hole CTD is disposed to overlap the second bank 600 in the third direction DR3 in the example shown in the drawings, the position of the first electrode contact hole CTD is not limited thereto.

The second electrode 220 may be electrically connected to the second voltage line VL2 through a second electrode contact hole CTS penetrating the via layer 165. The second electrode 220 may be in contact with the upper surface of the second voltage line VL2 exposed by the second electrode contact hole CTS. The second supply voltage may be applied to the second electrode 220 through the second voltage line VL2. Although the second electrode contact hole CTS is disposed to overlap the second bank 600 in the third direction DR3 in the example shown in the drawings, the position of the second electrode contact hole CTS is not limited thereto.

The first electrode 210 and the second electrode 220 disposed in each of the sub-pixels PXn may be extended in the second direction DR2 when viewed from the top, and may be separated from the first electrode 210 and the second electrode 220 of another sub-pixel PXn adjacent to it in the second direction DR2 at the separation regions ROPn of the subsidiary areas SAn, respectively. Such arrangement of the first electrode 210 and the second electrode 220 spaced apart from each other in the second direction DR2 may be formed by forming electrode lines extended in the second direction DR2 which are used during a process of aligning light-emitting diodes ED and disposing the light-emitting diodes ED thereon, and separating the electrode lines into parts at the separation regions ROPn of the subsidiary areas SAn during a subsequent process. The electrode lines may be used to generate an electric field in the pixels PX to align the light-emitting diodes ED during the process of fabricating the display device 10.

The first electrode 210 and the second electrode 220 may be electrically connected to the light-emitting diodes ED. The first electrode 210 and the second electrode 220 may be electrically connected to both ends of the light-emitting diodes ED through first contact electrode 710 and the second contact electrode 720, respectively, and may transmit electric signals applied from the circuit element layer CCL to the light-emitting diodes ED.

The electrode layer 200 may include a conductive material having high reflectance. For example, the electrode layer 200 may include a metal such as silver (Ag), copper (Cu), aluminum (Al), molybdenum (Mo) and titanium (Ti) as the material having a high reflectance, and may be an alloy including aluminum (Al), nickel (Ni), lanthanum (La), etc., within the spirit and the scope of the disclosure. The electrode layer 200 may reflect light that is emitted from the light-emitting diodes ED and travels toward the side surfaces of the first bank 400 toward the upper side of each of the sub-pixels PXn. It is, however, to be understood that the disclosure is not limited thereto. The electrode layer 200 may further include a transparent conductive material. For example, the electrode layer 200 may include a material such as ITO, IZO and ITZO. In an embodiment, the electrode layer 200 may have a structure in which one or more layers of a transparent conductive material and a metal layer having high reflectance may be stacked each other, or may be made up of a single layer including them. For example, the electrode layer 200 may have a stack structure such as ITO/Ag/ITO/, ITO/Ag/IZO, or ITO/Ag/ITZO/IZO.

The first insulating layer 510 may be disposed on the electrode layer 200. The first insulating layer 510 may be disposed to cover or overlap the electrode layer 200 and the via layer 165 exposed by the electrode layer 200. The first insulating layer 510 may include contacts exposing at least a part of the first electrode 210 and the second electrode 220. The contact electrodes 700 and the electrode layer 200 may be electrically connected to each other through the contacts exposing at least parts of the first electrode 210 and the second electrode 220. Although the contacts of the first insulating layer 510 exposing a part of the electrode layer 200 are disposed in the emission area EMA in the example shown in the drawings, the disclosure is not limited thereto. The contacts of the first insulating layer 510 exposing a part of the electrode layer 200 may be located or disposed in the subsidiary areas SAn of each of the sub-pixels PXn.

The first insulating layer 510 can protect the electrode layer 200, and can insulate the first electrode 210 and the second electrode 220 from each other. The first insulating layer 510 may also prevent that the light-emitting diodes ED disposed thereon are brought into contact with other elements and damaged. The first insulating layer 510 may include an inorganic insulating material.

The second bank 600 may be disposed on the first insulating layer 510. The second bank 600 may be disposed in a lattice pattern, including portions extended in the first direction DR1 and the second direction DR2 when viewed from the top.

The second bank 600 may be disposed at the boundaries of the sub-pixels PXn to distinguish between adjacent pixels PX, and may distinguish the emission area EMA from the subsidiary areas SAn of each of the sub-pixels PXn. The second bank 600 has a height greater than that of the first bank 400 to distinguish between the areas. Accordingly, during an inkjet printing process for aligning the light-emitting diodes ED of the process of fabricating the display device 10, it is possible to prevent that the ink in which the light-emitting diodes ED is dispersed is mixed into the adjacent sub-pixel PXn, and thus the ink can be ejected into the emission area EMA.

The second bank 600 may include an opening in line with the emission area EMA of each of the sub-pixels PXn to provide a space in which the scattering layer 800 and the wavelength control layer CWL are formed. The second bank 600 may include an organic insulating material, for example, polyimide (PI), but the disclosure is not limited thereto.

The light-emitting diodes ED may be disposed on the first insulating layer 510 in the emission area EMA. The light-emitting diodes ED may be disposed between the first and second sub-banks 410 and 420. The light-emitting diodes ED may be disposed on the first insulating layer 510 so that both ends of the light-emitting diodes ED are positioned or disposed on the first electrode 210 and the second electrode 220, respectively, between the first sub-bank 410 and the second sub-bank 420.

The light-emitting diodes ED may be spaced apart from one another along the second direction DR2 in which the first and second electrodes 210 and 220 are extended, and may be aligned substantially parallel to one another. The light-emitting diodes ED may have a shape extended in one direction or in a direction. The length of the light-emitting diodes ED may be larger than the shortest distance between the first electrode 210 and the second electrode 220 spaced apart from each other in the first direction DR1. At least one end or an end of each of the light-emitting diodes ED may be disposed on one of the first electrode 210 and the second electrode 220, or both ends of each of the light-emitting diodes ED may be disposed on the first electrode 210 and the second electrode 220, respectively.

The second insulating layer 520 may be disposed on the light-emitting diodes ED. The second insulating layer 520 may be disposed to partially surround the outer surface of the light-emitting diodes ED so that the both ends of the light-emitting diodes ED are not covered or overlapped. Accordingly, the width of the second insulating layer 520 in the first direction DR1 may be smaller than the length of the light-emitting diodes ED in the first direction DR1 in which the light-emitting diodes ED are extended. The part of the second insulating layer 520 which is disposed on the light-emitting diode ED may be extended in the second direction DR2 on the first insulating layer 510 when viewed from the top, thereby forming a linear or island-like pattern in each of the sub-pixels PXn. The second insulating layer 520 can protect the light-emitting diode ED and fix the light-emitting diode ED during the process of fabricating the display device 10.

The contact electrodes 700 may be disposed on the second insulating layer 520. The contact electrodes 700 may include contact electrodes spaced apart from one another. For example, the contact electrodes 700 may include a first contact electrode 710 and a second contact electrode 720 spaced apart from each other.

The first contact electrode 710 may be disposed on the first electrode 210 and the second insulating layer 520. The first contact electrode 710 may be disposed to expose a part of the upper surface of the second insulating layer 520.

The first contact electrode 710 may have a shape extended in the second direction DR2. The first contact electrode 710 may be in contact with the first electrode 210 and the first ends of the light-emitting diodes ED. The first contact electrode 710 may be in contact with the first ends of the light-emitting diodes ED exposed by the second insulating layer 520 in the emission area EMA. The first contact electrode 710 may be in contact with the first electrode 210 exposed by the contact penetrating the first insulating layer 510. The first contact electrode 710 is in contact with the first ends of the light-emitting diodes ED as well as the first electrode 210, to electrically connect the light-emitting diodes ED with the first electrode 210.

The third insulating layer 530 may be disposed on the first contact electrode 710. The third insulating layer 530 may be disposed on the first contact electrode 710 to cover or overlap the first contact electrode 710. The third insulating layer 530 may insulate the first contact electrode 710 from the second contact electrode 720. The third insulating layer 530 is disposed to cover or overlap the first contact electrode 710 and may be aligned with one sidewall or a sidewall of the second insulating layer 520.

The second contact electrode 720 may be disposed on the second electrode 220. The second contact electrode 720 may be disposed on the second electrode 220 and the third insulating layer 530.

The second contact electrode 720 may have a shape extended in the second direction DR2. The second contact electrode 720 may be in contact with the second electrode 220 and the second ends of the light-emitting diodes ED. The second contact electrode 720 may be in contact with the second ends of the light-emitting diodes ED exposed by the second insulating layer 520 and the third insulating layer 530 in the emission area EMA. The second contact electrode 720 may be in contact with the second electrode 220 exposed by the contact penetrating the first insulating layer 510. The second contact electrode 720 is in contact with the second ends of the light-emitting diodes ED as well as the second electrode 220, to electrically connect the light-emitting diodes ED with the second electrode 220.

The first ends of the light-emitting diodes ED exposed by the second insulating layer 520 may be electrically connected to the first electrode 210 through the first contact electrode 710, while the second ends of the light-emitting diodes ED exposed by the second insulating layer 520 and the third insulating layer 530 may be electrically connected to the second electrode 220 through the second contact electrode 720.

Although the first contact electrode 710 and the second contact electrode 720 are formed on different layers with the third insulating layer 530 therebetween in the example shown in the drawings, the disclosure is not limited thereto. For example, the first contact electrode 710 and the second contact electrode 720 may be formed on substantially a same layer and may be spaced apart from each other with the second insulating layer 520 therebetween. In such case, the third insulating layer 530 may be eliminated.

The contact electrodes 700 may include a conductive material. For example, the contact electrodes 700 may include ITO, IZO, ITZO, aluminum (Al), etc., within the spirit and the scope of the disclosure. For example, the contact electrodes 700 may include a transparent conductive material. The light emitted from the light-emitting diodes ED may transmit the contact electrodes 700 to proceed toward the first electrode 210 and the second electrode 220, and may be reflected off the outer surface of the first electrode 210 and the second electrode 220.

The scattering layer 800 may be disposed over the light-emitting diodes ED and the contact electrodes 700. The scattering layer 800 may be disposed over the third insulating layer 530 to cover or overlap elements disposed thereunder.

The scattering layer 800 may be disposed in the area defined by the second bank 600. The scattering layer 800 may be disposed in the opening of the second bank 600 exposing the light-emitting diodes ED. A part of the opening defined by the second bank 600 may be filled with the scattering layer 800. The scattering layer 800 may be in contact with a side surface of the second bank 600.

The scattering layer 800 may be disposed between the light-emitting diodes ED and the wavelength control layer CWL to disperse the lights emitted from the light-emitting diodes ED and incident on the wavelength control layer CWL, so that the lights emitted from the light-emitting diodes ED are incident on the wavelength control layer CWL with a more uniform luminance.

The scattering layer 800 may include a binder layer 810 and light-scattering particles 820 dispersed in the binder layer 810.

As the scattering layer 800 may include the binder layer 810, one surface or a surface of the scattering layer 800 may have a generally flat surface. By virtue of the scattering layer 800, a flat surface can be provided over the light-emitting diodes ED, the first bank 400, the electrode layer 200, the contact electrodes 700 and the insulating layers 510, 520 and 530.

The binder layer 810 may include a light-transmitting material. The binder layer 810 is a medium in which the light-scattering particles 820 are dispersed, and may include various resin compositions, an ink, etc., within the spirit and the scope of the disclosure. It should be understood that the disclosure is not limited thereto. Any medium can be referred to as the binder layer 810 irrespective of its name, additional other functionality, its composition material, etc., within the spirit and the scope of the disclosure. as long as it can disperse scattering particles.

The light-scattering particles 820 may have a refractive index different from that of the binder layer 810. The light-scattering particles 820 may include metal oxide particles or polymer particles. Examples of the metal oxide particles may include titanium oxide ($TiO_2$), zirconium oxide ($ZrO_2$), aluminum oxide ($Al_2O_3$), indium oxide ($In_2O_3$), zinc oxide ($ZnO_2$), silica (Silica), barium sulfate ($BaSO_4$), tin oxide ($SnO_2$), etc., within the spirit and the scope of the disclosure. Examples of the polymer particles may include polystyrene, polymethyl methacrylate (PMMA), etc., within the spirit and the scope of the disclosure. The light-scattering particles 820 may have, but is not limited to, a hollow structure. The light-scattering particles 820 may have a content range of approximately 50 w % or less of the total solids in the scattering layer 800.

The size of the light-scattering particles 820 may be related to the wavelength of light emitted by the light-emitting diodes ED. For example, the size of the light-scattering particles 820 may be in a range of about $\lambda/0$ to about $5\lambda$, and for example, about $\lambda/2$ if the wavelength of light emitted by the light-emitting diodes ED is $\lambda$. It should be understood that the disclosure is not limited thereto. For example, in case that the light emitted from the light-emitting diodes ED has a peak wavelength equal to or less than about 480 nm, for example, in a range of about 445 nm to about 480 nm, the size of the light-scattering particles 820 for example may be in a range of about 150 nm to about 300 nm.

The upper surface of the scattering layer 800 may be located or disposed at a level lower than the upper surface of the second bank 600. In other words, the thickness of the scattering layer 800 may be smaller than the height of the second bank 600. If the scattering layer 800 is too thick, transmittance of light emitted from the light-emitting diodes ED may be reduced. The thickness of the scattering layer 800 may be in a range of about 0.5 µm to about 100 µm, for example about 0.5 µm to about 5 µm, but the disclosure is not limited thereto.

The scattering layer 800 may also serve to fix the light-emitting diodes ED by assisting the second insulating layer 520. The scattering layer 800 may be disposed to cover or overlap all outer surfaces of the light-emitting diodes ED. Although the second insulating layer 520 is disposed on the light-emitting diodes ED in the example shown in the drawings, the disclosure is not limited thereto. For example, the second insulating layer 520 may be eliminated, and the light-emitting diodes ED may be fixed on the electrode layer 200 by the scattering layer 800.

The light-emitting diodes ED disposed in the emission area EMA may be particle-type elements and may have a size of a nanometer scale (from about 1 nm to about 1 µm) to a micrometer scale (from about 1 µm to about 1 mm). Each of the light-emitting diodes ED may be a point light source that emits light from its active layer 33 as described below. The light-emitting diodes ED may be closely aligned between the first electrode 210 and the second electrode 220 in the emission area EMA. Lights are randomly emitted from the light-emitting diodes ED through the outer surface of the light-emitting diodes ED. However, the light-emitting diodes ED are point light sources and are densely aligned in the center of the emission area EMA. Therefore, the lights emitted from the light-emitting diodes ED may be densely distributed at the center of the emission area EMA in which the light-emitting diodes ED are arranged or disposed when viewed from the top.

Referring to FIGS. 5 and 6, the scattering layer 800 may serve to guide the lights L emitted from the light-emitting diodes ED at the center of the emission area EMA as if the lights are emitted from a surface light source. The lights L emitted from the light-emitting diodes ED and incident on the scattering layer 800 at the center of the emission area EMA when viewed from the top may be dispersed by the light-scattering particles 820 of the scattering layer 800. The lights L dispersed by the scattering layer 800 and incident from the scattering layer 800 on the wavelength control layer CWL may have a Lambertian distribution. Accordingly, since the light L emitted from the light-emitting diodes ED may be incident on the wavelength control layer CWL in a uniform distribution by the scattering layer 800, it is possible to prevent the wavelength control layer CWL from being damaged by thermal energy of the light.

The wavelength control layer CWL (the first wavelength conversion pattern WCL1 in the drawing) may be disposed on the scattering layer 800. The wavelength control layer CWL may be disposed in the area defined by the second bank 600. The wavelength control layer CWL may be disposed on the scattering layer 800 in the opening of the second bank 600. The wavelength control layer CWL may be in contact with one surface or a surface of the scattering layer 800. A pattern of the wavelength control layer CWL may be similar to that of the scattering layer 800 disposed thereunder when viewed from the top. The wavelength control layer CWL may be in contact with a side surface of the second bank 600.

According to this embodiment, by disposing the scattering layer 800 including the light-scattering particles 820 between the light-emitting diodes ED and the wavelength control layer CWL, it is possible to guide the lights L emitted from the light-emitting diodes ED which are point light sources as if they are emitted from a surface light source. Accordingly, by dispersing the lights L emitted from the light-emitting diodes ED and incident on the wavelength control layer CWL, it is possible to increase the area of the wavelength control layer CWL on which the lights L are incident, and to control the distribution of lights incident on the wavelength control layer CWL uniformly. In case that the area of the wavelength control layer CWL on which the lights L emitted from the light-emitting diodes ED are incident is increased, the amount of incident light per area of the wavelength control layer CWL can be reduced. Accordingly, the distribution of the light incident on the wavelength control layer CWL is uniform and the incidence area is increased, so that it is possible to prevent the wavelength control layer CWL from being damaged by thermal energy of the light incident on the wavelength control layer CWL. As a result, the display quality of the display device 10 can be improved.

Figure 7:
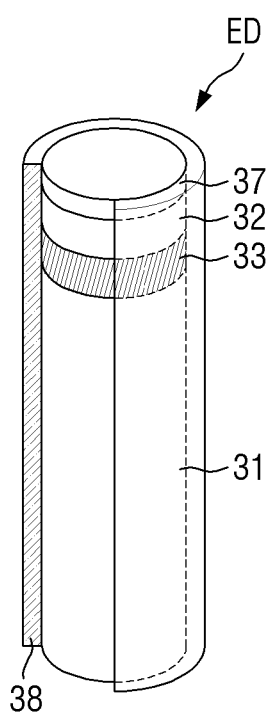
FIG. 7 is a schematic perspective view of a light-emitting element according to an embodiment.

FIG. 7 is a schematic perspective view of a light-emitting element according to an embodiment.

Referring to FIG. 7, the light-emitting diode ED may be a particle-type element, and may have a rod-like or substantially cylindrical shape having an aspect ratio. The length of the light-emitting diode ED may be larger than the diameter of the light-emitting diode ED, and the aspect ratio may range from, but is not limited to, about 6:5 to about 100:1.

The light-emitting element ED may have a size of a nanometer scale (in a range of about 1 nm to about 1 µm) to a micrometer scale (in a range of about 1 µm to about 1 mm). According to an embodiment, both of the diameter and length of the light-emitting element ED may have nanometer scales or micrometer scales. In embodiments, the diameter of the light-emitting element ED may have a nanometer scale, while the length of the light-emitting element ED may have a micrometer scale. In an embodiment, the diameter and/or length of some of the light-emitting elements ED may have nanometer scales, while the diameter and/or length of some others of the light-emitting elements ED have micrometer scales.

According to an embodiment, the light-emitting element ED may be an inorganic light-emitting diode. The inorganic light-emitting diode may include semiconductor layers. For example, the inorganic light-emitting diode may include a first conductivity type (for example, n-type) semiconductor layer, a second conductivity type (for example, p-type) semiconductor layer, and an active semiconductor layer interposed therebetween. The active semiconductor layer may receive holes and electrons from the first conductivity-type semiconductor layer and the second conductivity-type semiconductor layer, respectively, and the holes and electrons reaching the active semiconductor layer may be combined to emit light.

According to an embodiment, the above-described semiconductor layers may be sequentially stacked along or in a direction which is the longitudinal direction of the light-emitting diode ED. The light-emitting diode ED may include a first semiconductor layer 31, an active layer 33 and a second semiconductor layer 32 sequentially stacked in a direction. The first semiconductor layer 31, the active layer 33 and the second semiconductor layer 32 may be the first conductivity type semiconductor layer, the active semiconductor layer, and the second conductivity type semiconductor layer described above, respectively.

The first semiconductor layer 31 may be doped with a first conductivity type dopant. The first conductivity type dopant may be Si, Ge, Sn, etc., within the spirit and the scope of the disclosure. According to an embodiment, the first semiconductor layer 31 may be n-GaN doped with n-type Si.

The second semiconductor layer 32 may be spaced apart from the first semiconductor layers 31 with the active layer 33 therebetween. The second semiconductor layer 32 may be doped with a second conductivity-type dopant such as Mg, Zn, Ca, Se and Ba. According to an embodiment, the second semiconductor layer 32 may be p-GaN doped with p-type Mg.

The active layer 33 may include a material having a single or multiple quantum well structure. As described above, the active layer 33 may emit light as electron-hole pairs are combined therein in response to an electrical signal applied through the first semiconductor layer 31 and the second semiconductor layer 32.

In an embodiment, the active layer 33 may have a structure in which a semiconductor material having a large band gap energy and a semiconductor material having a small band gap energy may be alternately stacked each other, and may include other Group III to Group V semiconductor materials depending on the wavelength range of the emitted light.

The light emitted from the active layer 33 may exit not only through the both end surfaces of the light-emitting diode ED in the longitudinal direction but also through the outer peripheral surface (or outer surface, side surface) of the light-emitting diode ED. The directions in which the light emitted from the active layer 33 propagates are not limited to one direction or a direction.

The light-emitting diode ED may further include an element electrode layer 37 disposed on the second semiconductor layer 32. The element electrode layer 37 may be in contact with the second semiconductor layer 32. The element electrode layer 37 may be an ohmic contact electrode but is not limited to it. It may be a schottky contact electrode.

In case that the both ends of the light-emitting diode ED are electrically connected to the contact electrodes 700 to apply electric signals to the first and second semiconductor layers 31 and 32, the element electrode layer 37 may be disposed between the second semiconductor layer 32 and the electrode to reduce the resistance. The element electrode layer 37 may include at least one of aluminum (Al), titanium (Ti), indium (In), gold (Au), silver (Ag), indium tin oxide (ITO), indium zinc oxide (IZO) and indium tin-zinc oxide (ITZO). The element electrode layer 37 may include a semiconductor material doped with n-type or p-type impurities.

The light-emitting diode ED may further include an insulating film 38 surrounding the outer peripheral surfaces of the first semiconductor layer 31, the second semiconductor layer 32, the active layer 33 and/or the element electrode layer 37. The insulating film 38 may be disposed to surround at least the outer surface of the active layer 33, and may be extended in a direction in which the light-emitting element ED is extended. The insulating film 38 can protect the above-described elements. The insulating film 38 may be made of materials having insulating properties and can prevent an electrical short-circuit that may occur in case that the active layer 33 comes in contact with an electrode through which an electric signal is transmitted to the light-emitting diode ED. Since the insulating film 38 may include the active layer 33 to protect the outer peripheral surfaces of the first and second semiconductor layers 31 and 32, it is possible to prevent a decrease in luminous efficiency.

Figure 8:
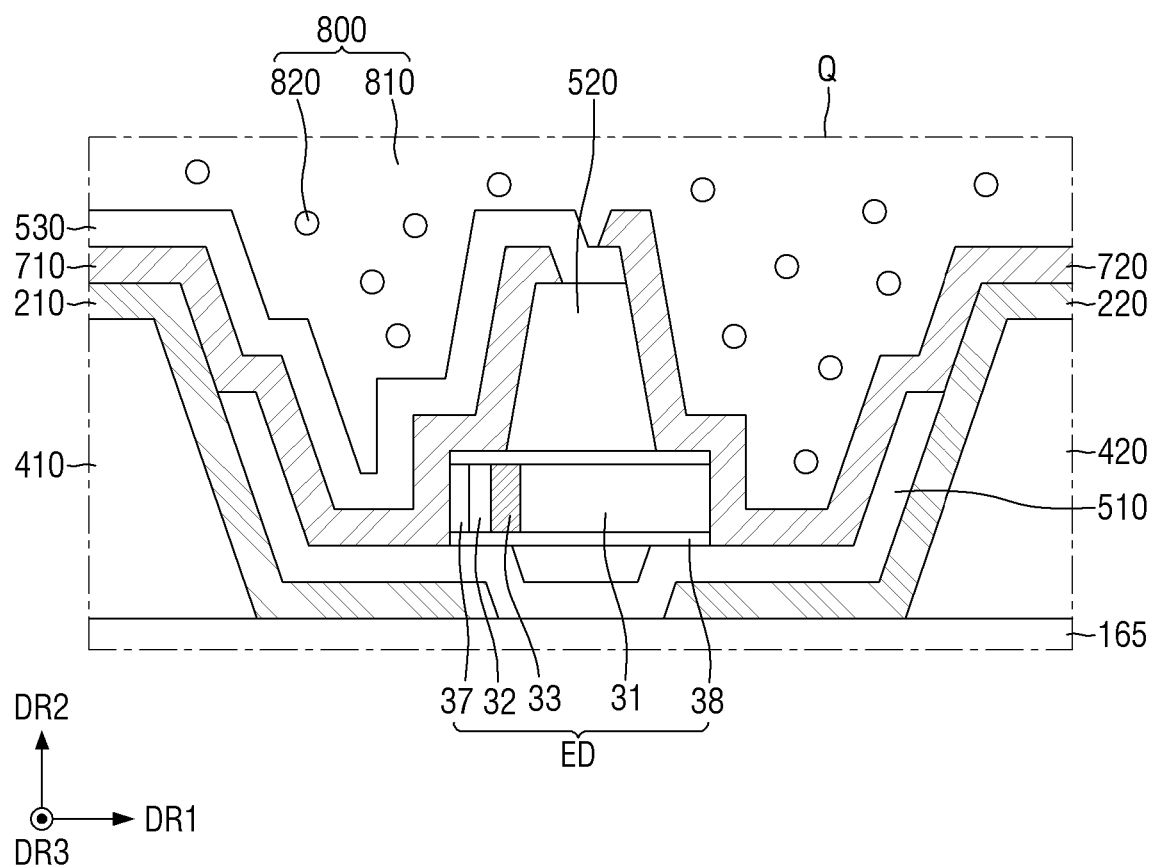
FIG. 8 is an enlarged schematic cross-sectional view showing an example of area Q of FIG. 5.

FIG. 8 is an enlarged schematic cross-sectional view showing an example of area Q of FIG. 5.

Referring to FIGS. 7 and 8, the light-emitting diode ED may be disposed such that the direction in which it is extended is parallel to the upper surface of the substrate SUB. The semiconductor layers included in the light-emitting diode ED may be arranged or disposed sequentially along the direction parallel to the upper surface of the substrate SUB. For example, the first semiconductor layer 31, the active layer 33 and the second semiconductor layer 32 of the light-emitting diode ED may be arranged or disposed sequentially parallel to the upper surface of the substrate SUB.

The first semiconductor layer 31, the active layer 33, the second semiconductor layer 32 and the element electrode layer 37 of the light-emitting diode ED may be sequentially formed parallel to the surface of the substrate SUB in the cross section passing through the both ends.

A first end of the light-emitting diode ED may be located or disposed on the first electrode 210, while a second end thereof may be located or disposed on the second electrode 220. It should be understood that the disclosure is not limited thereto. The first end of the light-emitting diode ED may be located or disposed on the second electrode 220, while the second end thereof may be located or disposed on the first electrode 210.

The second insulating layer 520 may be disposed on the light-emitting diode ED. The second insulating layer 520 may be disposed to surround the outer surface of the light-emitting diode ED. The second insulating layer 520 may be disposed to surround the outer surface of the light-emitting diode ED where the light-emitting diode ED is disposed, and may be disposed on the first insulating layer 510 where the light-emitting diode ED is not disposed.

The first contact electrode 710 may be in contact with a first end of the light-emitting diode ED exposed by the second insulating layer 520. The first contact electrode 710 may be disposed to surround the outer surface and an end surface of the light-emitting diode ED exposed by the second insulating layer 520. The first contact electrode 710 may be in contact with the insulating film 38 and the element electrode layer 37 of the light-emitting diode ED.

The second contact electrode 720 may be in contact with the second end of the light-emitting diode ED exposed by the second insulating layer 520 and the third insulating layer 530. The second contact electrode 720 may be disposed to surround the outer surface and the second end of the light-emitting diode ED exposed by the second insulating layer 520 and the third insulating layer 530. The second contact electrode 720 may be in contact with the insulating film 38 and the first semiconductor layer 31 of the light-emitting diode ED.

Figure 9:
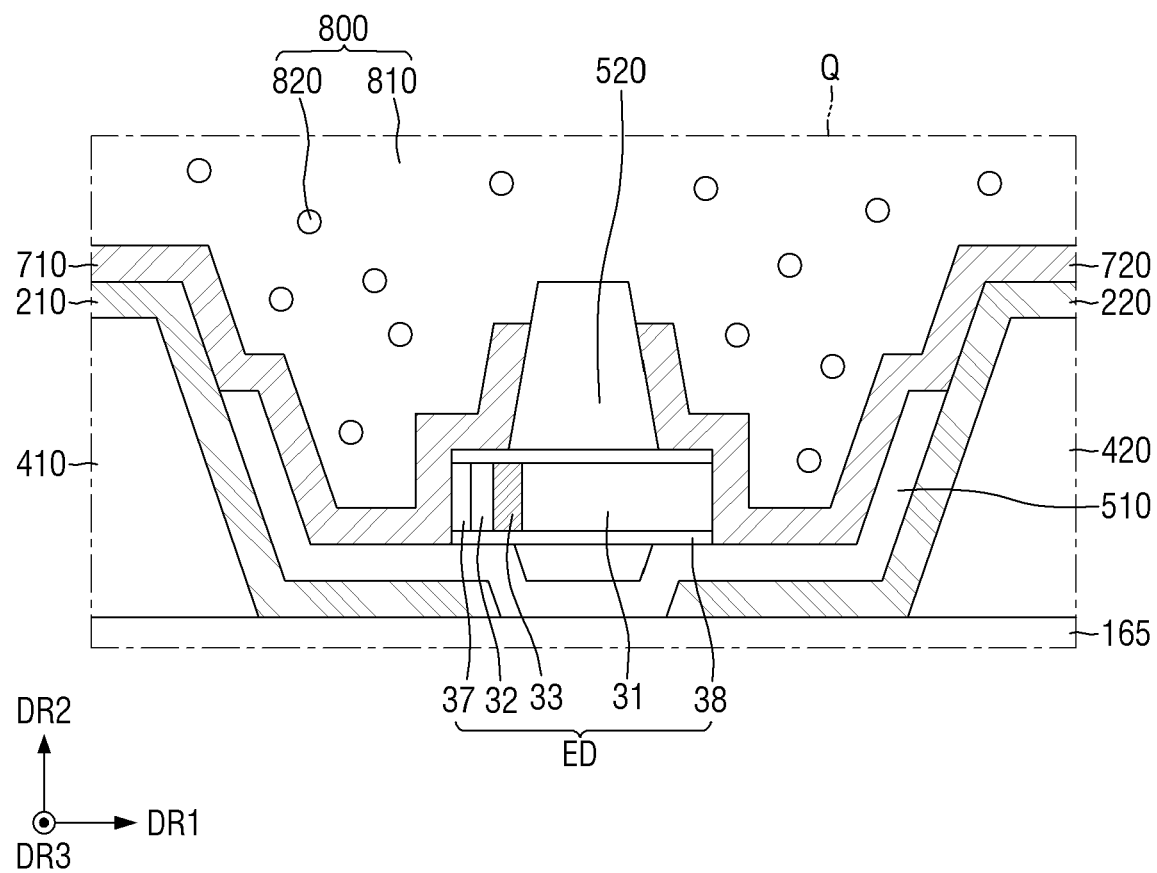
FIG. 9 is an enlarged schematic cross-sectional view showing another example of area Q of FIG. 5.

FIG. 9 is an enlarged schematic cross-sectional view showing another example of area Q of FIG. 5.

The embodiment of FIG. 9 is different from the embodiment of FIG. 8 in that a first contact electrode 710 and a second contact electrode 720 are formed on a same layer, and the third insulating layer 530 is eliminated from a display device 10.

The first and second contact electrodes 710 and 720 may be disposed on or directly disposed on the second insulating layer 520. The first contact electrode 710 and the second contact electrode 720 may be formed on a same layer. The first contact electrode 710 and the second contact electrode 720 may include a same material or a similar material. The first contact electrode 710 and the second contact electrode 720 may be formed together via a single mask process. Therefore, no additional mask process is required to form the first and second contact electrodes 710 and 720, and thus the efficiency of the process of fabricating the display device 10 can be improved.

The first contact electrode 710 and the second contact electrode 720 may be spaced apart from each other with the second insulating layer 520 therebetween. The first contact electrode 710 and the second contact electrode 720 may expose at least a part of the upper surface of the second insulating layer 520.

This embodiment is identical to the embodiment of FIG. 8 except that the third insulating layer 530 is eliminated; and, therefore, the redundant descriptions will be omitted.

Figure 10:
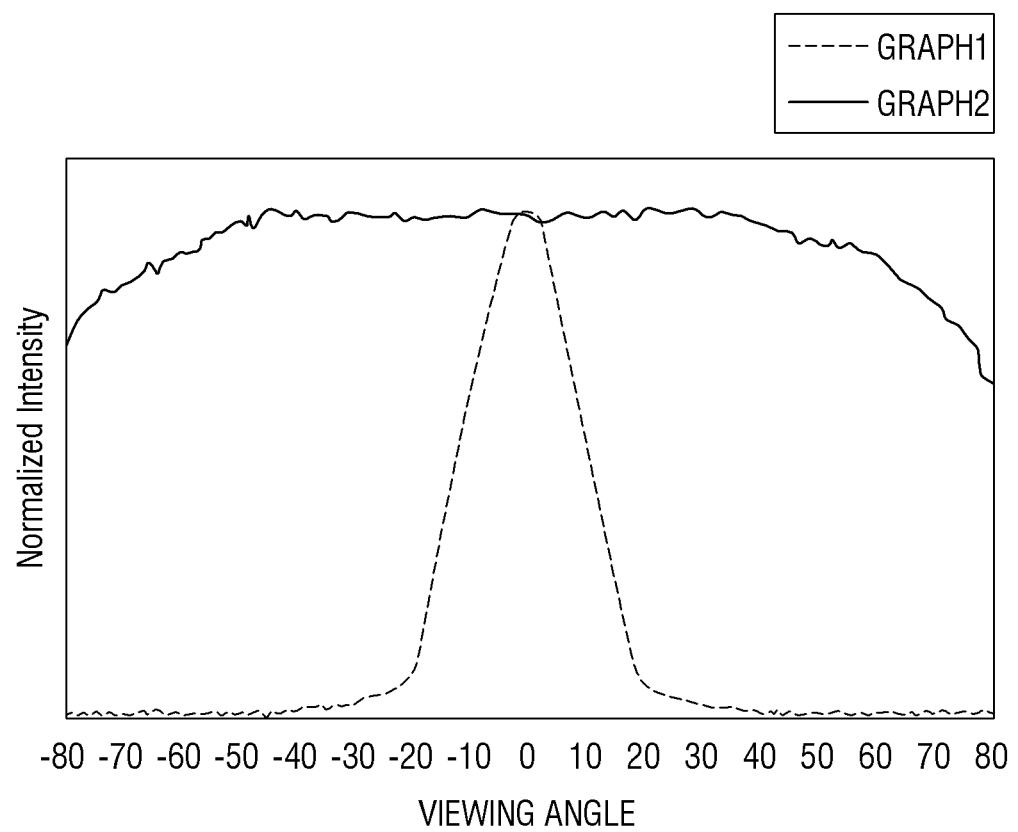
FIG. 10 is a graph showing intensity of light versus viewing angle of a display device according to an embodiment.

FIG. 10 is a graph showing intensity of light versus viewing angle of a display device according to an embodiment.

The graph shown in FIG. 10 was obtained by normalizing the intensity of light for different viewing angles in one sub-pixel of the display device 10. Curve 1 is Comparative Example, which was obtained by normalizing the intensity of lights for different viewing angles in a structure in which the scattering layer 800 is not disposed above the light-emitting diode ED. Curve 2 was obtained by normalizing the intensity of lights for different viewing angles in a structure in which the scattering layer 800 is disposed above the light-emitting diode ED according to an embodiment. In the graph shown in FIG. 10, the curves were normally distributed, and thus the value of the highest point is 1 and the remaining values are expressed as relative values with respect to the highest point.

It can be seen from Curve 1 shown in FIG. 10 that the intensity of lights is densely distributed at viewing angles between −10 degrees and 10 degrees in case that the scattering layer 800 is not disposed above the light-emitting diode ED. In contrast, it can be seen from Curve 2 shown in FIG. 10 that the intensity of lights hardly changes up to 70 degrees on both sides from the front in case that the scattering layer 800 is disposed above the light-emitting diode ED. In view of the above, it can be seen that the lights emitted from the light-emitting diodes ED have a Lambertian light distribution having a uniform distribution for different viewing angles by further disposing the scattering layer 800 above the light-emitting diodes ED.

Therefore, as in the embodiment, by disposing the scattering layer 800 between the light-emitting diodes ED and the wavelength control layer CWL, it is possible to scatter the lights emitted from the light-emitting diodes ED, which are the point light sources, to guide the lights to the wavelength control layer CWL as if they are emitted from a surface light source. As a result, it is possible to prevent damage to the wavelength control layer CWL.

Hereinafter, other embodiments will be described. In the following description, the same or similar elements will be denoted by the same or similar reference numerals, and redundant descriptions will be omitted or briefly described. Descriptions will be made focusing on differences from the above embodiment.

Figure 11:
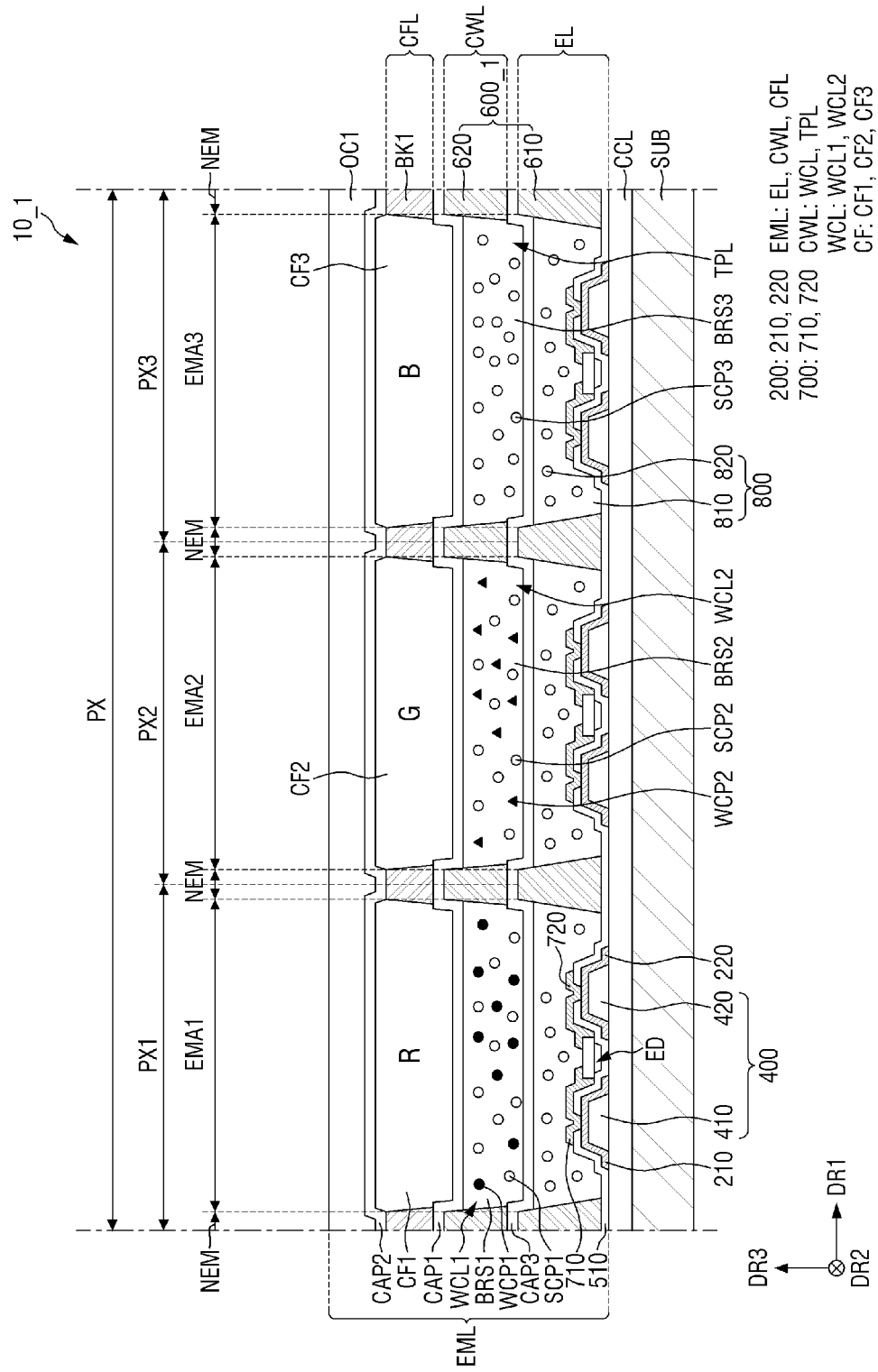
FIG. 11 is a schematic cross-sectional view of a display device according to an embodiment.

FIG. 11 is a schematic cross-sectional view of a display device according to an embodiment.

A display device 10_1 according to the embodiment of FIG. 11 is different from the display device according to the embodiment of FIG. 3 in that a second bank 600_1 may include a lower bank 610 and an upper bank 620 disposed on the lower bank 610, and that a third capping layer CAP3 is further included between the light-emitting element layer EL and the wavelength control layer CWL.

The second bank 600_1 may include the lower bank 610 and the upper bank 620.

The lower bank 610 may be disposed on the first insulating layer 510. The lower bank 610 may include an opening exposing the first bank 400 and the light-emitting diodes ED disposed in each of the first to third emission areas EMA1, EMA2 and EMA3. The lower bank 610 may be disposed in the non-emission area NEM. The lower bank 610 may be disposed at the boundaries between the first to third sub-pixels PX1, PX2 and PX3.

During an inkjet printing process for aligning the light-emitting diodes ED of the process of fabricating the display device 10, the lower bank 610 may work as partition walls which prevents that the ink in which the light-emitting diodes ED is dispersed is mixed into the adjacent sub-pixel PXn so that the ink can be ejected into the emission area EMA. The lower bank 610 may include an organic insulating material, for example, an organic material such as polyimide (PI).

A reflective layer may be further disposed on a side surface of the lower bank 610. In case that the reflective layer is further disposed on the side surface of the lower bank 610, it may serve to reflect the traveling direction of light that is emitted from the light-emitting diodes ED and travels toward the side surface of the lower bank 610 toward the display side.

The scattering layer 800 may be disposed in an area defined by the lower bank 610. The scattering layer 800 may be disposed in the opening of the lower bank 610 exposing the light-emitting diodes ED. As described above, the scattering layer 800 may be disposed to fill the opening defined by the lower bank 610. The scattering layer 800 disposed in each of the sub-pixels PX1, PX2 and PX3 may be spaced apart from another one, with the lower bank 610 therebetween. The scattering layer 800 may be in contact with a side surface of the lower bank 610.

The third capping layer CAP3 may be disposed on the light-emitting element layer EL. The third capping layer CAP3 may be disposed along the entire surface of the display device 10. The third capping layer CAP3 may encapsulate the upper surface of the light-emitting element layer EL. The third capping layer CAP3 may encapsulate the scattering layer 800 and the lower bank 610. The third capping layer CAP3 may be disposed on the lower surface of the wavelength control layer CWL to encapsulate the wavelength control layer CWL. Since the third capping layer CAP3 encapsulates the lower surface of the wavelength control layer CWL, permeation of impurities such as moisture and air can be prevented, thereby preventing damage to the wavelength control layer CWL.

The third capping layer CAP3 may include an inorganic material. For example, the third capping layer CAP3 may include at least one of: silicon nitride, aluminum nitride, zirconium nitride, titanium nitride, hafnium nitride, tantalum nitride, silicon oxide, aluminum oxide, titanium oxide, tin oxide, cerium oxide and silicon oxynitride. Although the third capping layer CAP3 is formed as a single layer in the drawings, the disclosure is not limited thereto. For example, the third capping layer CAP3 may be made up of multiple layers in which inorganic layers including at least one of the materials listed above as materials that the third capping layer CAP3 may be alternately stacked each other.

The upper bank 620 may be disposed on the third capping layer CAP3. The upper bank 620 may be disposed at the boundaries between the first to third sub-pixels PX1, PX2 and PX3. The upper bank 620 may be disposed above the lower bank 610. The upper bank 620 may overlap the lower bank 610. The upper bank 620 may be disposed in the non-emission area NEM, and may include an opening that defines each of the first to third emission areas EMA1, EMA2 and EMA3. The wavelength control layer CWL may be disposed in the opening defined by the upper bank 620.

The upper bank 620 may serve to block light emitted from the light-emitting element layer EL from being mixed into the emission areas EMA of the adjacent sub-pixels PXn. The upper bank 620 may also work as partition walls forming the wavelength control layer CWL.

The upper bank 620 may include an organic material. The upper bank 620 may include a light-absorbing material that absorbs light in a visible wavelength band. For example, the upper bank 620 may be made of a material used as a black matrix of the display device 10. The upper bank 620 may be a type of light-blocking member.

The wavelength control layer CWL may be disposed on the third capping layer CAP3. The wavelength control layer CWL may be disposed in the opening defined by the upper bank 620 on the third capping layer CAP3. The wavelength control layer CWL may be formed in the opening defined by the upper bank 620 by inkjet printing or the like within the spirit and the scope of the disclosure.

In the display device 10_1 according to this embodiment, the second bank 600_1 may include the lower bank 610 and the upper bank 620, and the wavelength control layer CWL and the scattering layer 800 may be disposed in the openings defined by the lower bank 610 and the upper bank 620, respectively. The third capping layer CAP3 is interposed between the wavelength control layer CWL and the scattering layer 800 to encapsulate the lower surface of the wavelength control layer CWL, thereby preventing damage to the wavelength control layer CWL.

Figure 12:
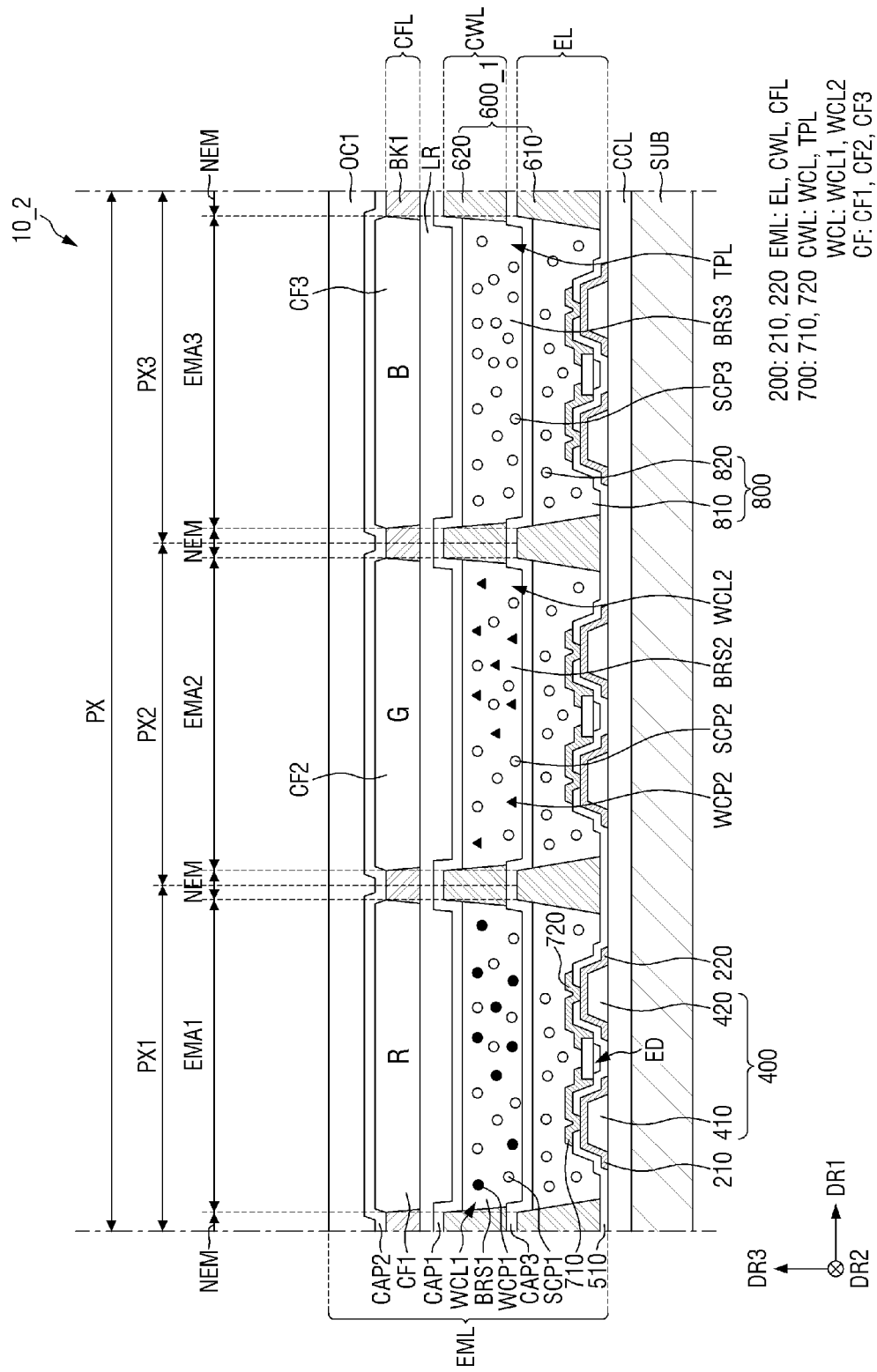
FIG. 12 is a schematic cross-sectional view of a display device according to an embodiment.

FIG. 12 is a schematic cross-sectional view of a display device according to an embodiment.

A display device 10_2 according to the embodiment of FIG. 12 is different from the display device according to the embodiment of FIG. 11 in that a low-refractive layer LR is further disposed between the wavelength control layer CWL and the color filter layer CFL.

The low-refractive layer LR may be interposed between the wavelength control layer CWL and the color filter layer CFL. The low-refractive layer LR may be interposed between the first capping layer CAP1 and the color filter layer CFL. The low-refractive layer LR may be disposed along the entire surface of the display device 10. The low-refractive layer LR may be interposed between the wavelength control layer CWL and the color filter layer CFL to prevent total reflection of light incident on the color filter layer CFL from the wavelength control layer CWL.

The low refractive layer LR may have a refractive index lower than the wavelength control layer CWL. For example, in case that the wavelength control layer CWL has the refractive index in a range of about 1.5 to about 1.6, the refractive index of the low-refractive layer LR may be in a range of about 1.4 or less, and for example, in a range of about 1 to about 1.2 or less. The low-refractive layer LR having a lower refractive index than that of the wavelength control layer CWL is interposed between the color filter layer CFL and the wavelength control layer CWL, so that it is possible to prevent total reflection of light incident on the color filter layer CFL from the wavelength control layer CWL. As a result, the luminance of the display device 10 can be increased. Although not limited thereto, the thickness of the low-refractive layer LR may be in a range of about 0.2 µm to about 5 µm.

Figure 13:
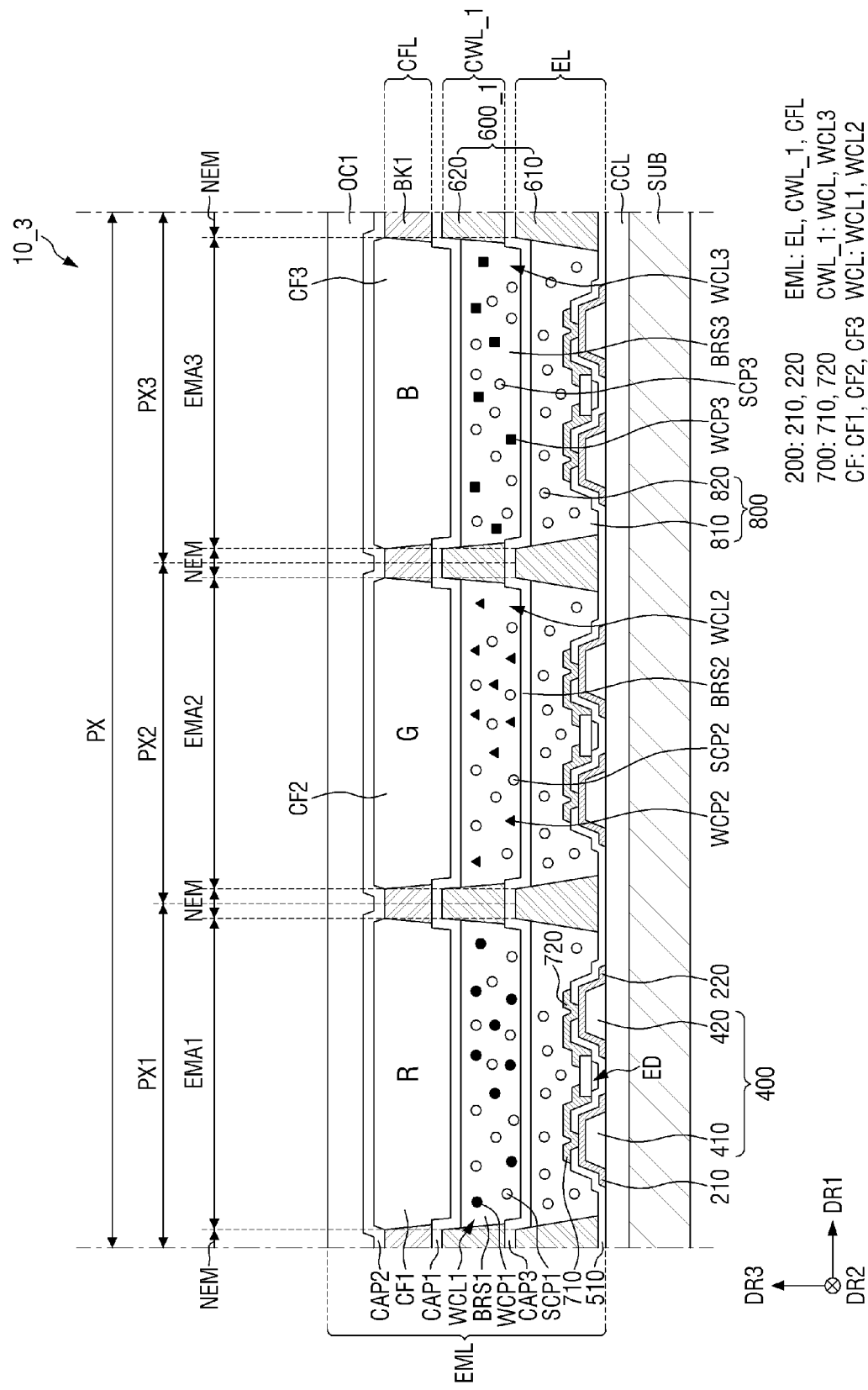
FIG. 13 is a schematic cross-sectional view of a display device according to an embodiment.

FIG. 13 is a schematic cross-sectional view of a display device according to an embodiment.

An embodiment of FIG. 13 is different from the embodiment of FIG. 11 in that a first pattern WCL3 further including a blue pigment WCP3 is disposed in a third sub-pixel PX3 in a display device 10_3.

A wavelength control layer CWL_1 may include a first pattern WCL3 disposed in the third sub-pixel PX3. The first wavelength conversion pattern WCL1 may be disposed in the first emission area EMA1 of the first sub-pixel PX1, the second wavelength conversion pattern WCL2 may be disposed in the second emission area EMA2 of the second sub-pixel PX2, and the first pattern WCL3 may be disposed in the third emission area EMA3 of the third sub-pixel PX3.

The first pattern WCL3 may be disposed in the opening defined by the upper bank 620 in the third sub-pixel PX3. The first pattern WCL3 may include a third base resin BRS3, third scatterers SCP3 dispersed in the third base resin BRS3, and blue pigments WCP3 dispersed in the third base resin BRS3. According to an embodiment, the pigments WCP3 may include a blue pigment. As the first pattern WCL3 may include the blue pigment, a third color light (for example, blue light) among the light incident on the first pattern WCL3 may be selectively transmitted, while the light of the first color (for example, red light) and the light of the second color (for example, green light) may be blocked or absorbed.

Figure 14:
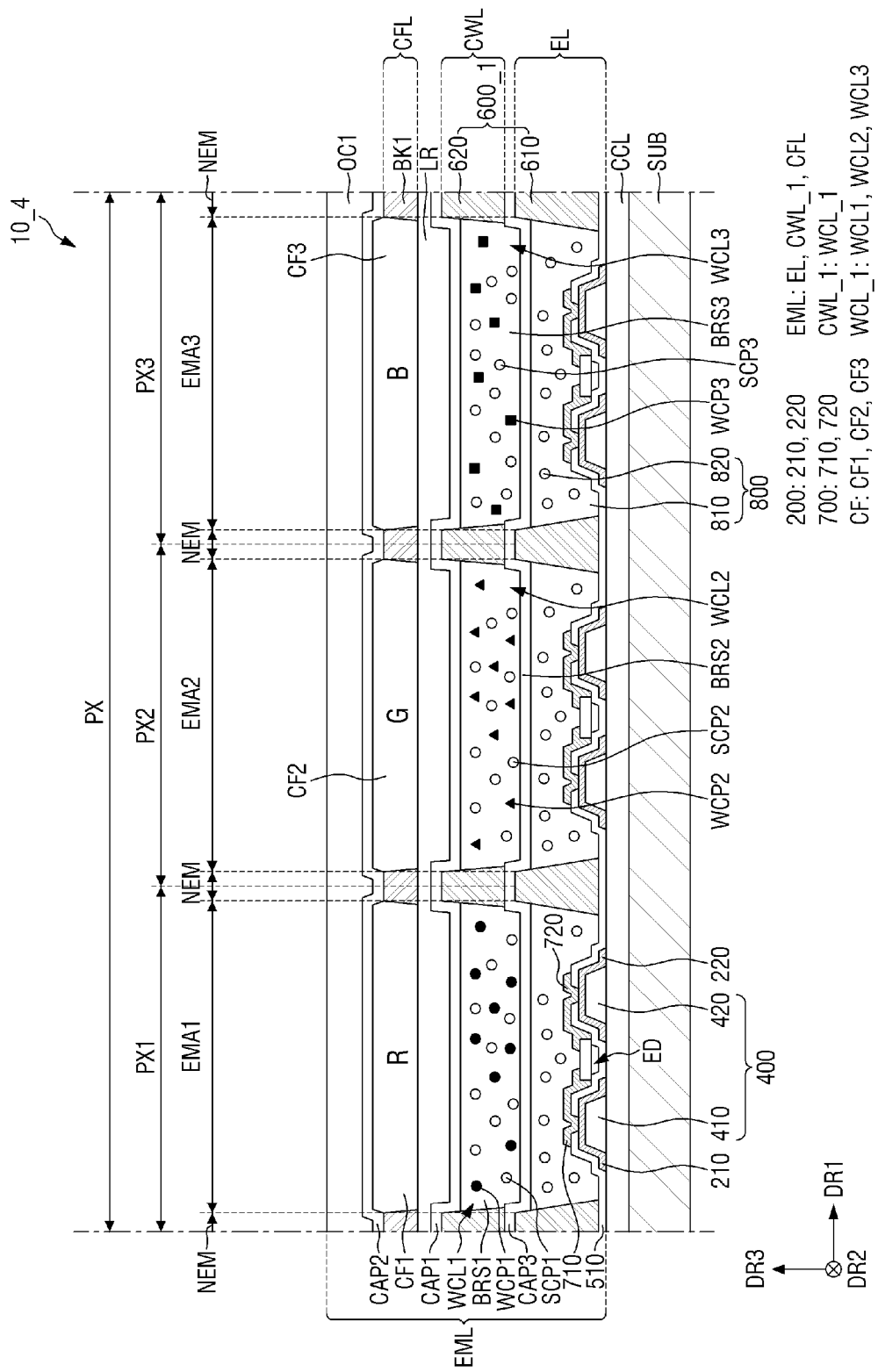
FIG. 14 is a schematic cross-sectional view of a display device according to an embodiment.

FIG. 14 is a schematic cross-sectional view of a display device according to an embodiment.

A display device 10_4 according to the embodiment of FIG. 14 is different from the display device according to the embodiment of FIG. 13 in that a low-refractive layer LR is further disposed between the wavelength control layer CWL and the color filter layer CFL.

The display device 10_4 according to this embodiment is substantially identical to the display device 10_3 of FIG. 13 except that the low-refractive layer LR may be further disposed between the wavelength control layer CWL and the color filter layer CFL. Accordingly, the low-refractive layer LR may overlap the first wavelength conversion pattern WCL1 disposed in the first sub-pixel PX1, the second wavelength conversion pattern WCL2 disposed in the second sub-pixel PX2, and the first pattern WCL3 disposed in the third sub-pixel PX3.

Figure 15:
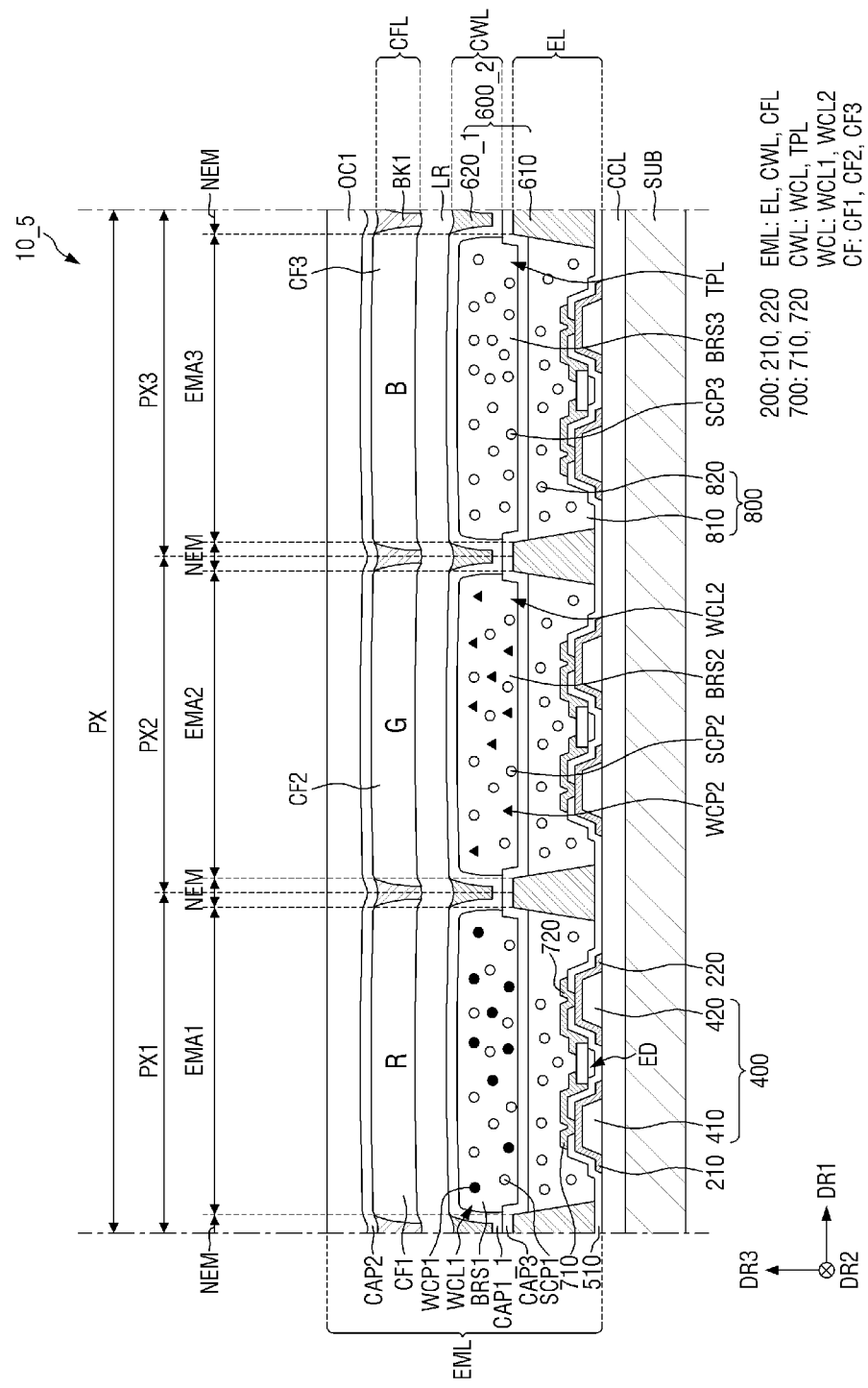
FIG. 15 is a schematic cross-sectional view of a display device according to an embodiment.

FIG. 15 is a schematic cross-sectional view of a display device according to an embodiment.

The embodiment of FIG. 15 is different from the embodiment of FIG. 11 in that an upper bank 620_1 is disposed on a first capping layer CAP1_1 in a display device 10_5.

The wavelength control layer CWL may be disposed in the emission area EMA of each sub-pixel PXn. The wavelength control layer CWL disposed in the emission area EMA of each sub-pixel PX may be spaced apart from another one.

The first capping layer CAP1_1 may be disposed on the wavelength control layer CWL. The first capping layer CAP1_1 may be disposed to cover or overlap the outer surface of the wavelength control layer CWL. The first capping layer CAP1_1 may cover or overlap not only the surface of the wavelength control layer CWL but also a side surface of the first capping layer CAP1_1. The first capping layer CAP1_1 may be in contact with the third capping layer CAP3 in the space between the adjacent wavelength control layers CWL. The first capping layer CAP1_1 may have a shape substantially conforming to the level difference created by the wavelength control layer CWL.

The upper bank 620_1 may be disposed between the wavelength control layers CWL disposed in the adjacent sub-pixels PXn. The upper bank 620_1 may be disposed on the third capping layer CAP3 between the wavelength control layers CWL of the adjacent sub-pixels PXn. The valley formed between the wavelength control layers CWL of the adjacent sub-pixels may be filled with the upper bank 620_1.

The wavelength control layer CWL may be completely encapsulated by the first capping layer CAP1_1 and the third capping layer CAP3. Accordingly, it is possible to further prevent that oxygen or moisture permeates into the wavelength control layer CWL.

Figure 16:
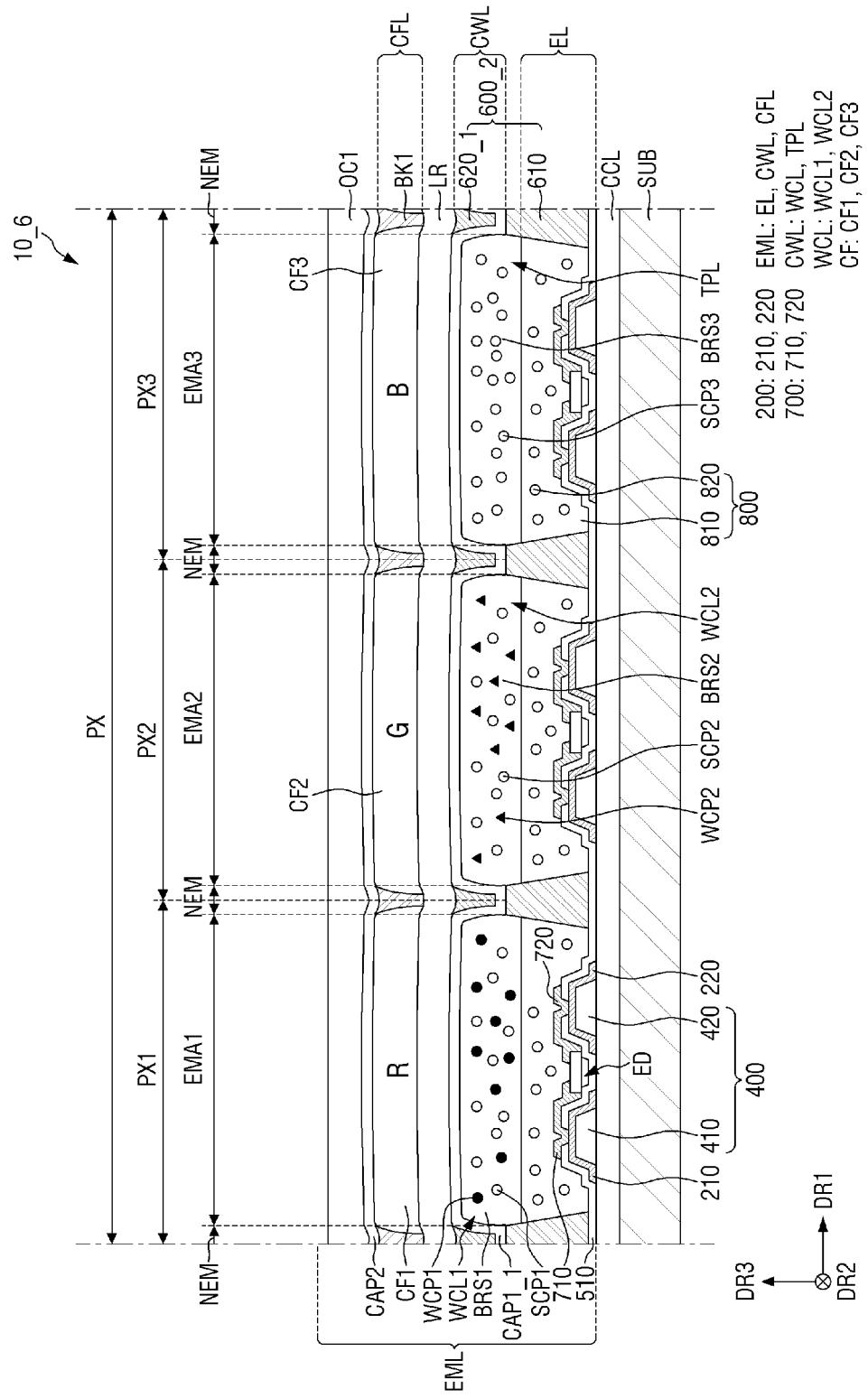
FIG. 16 is a schematic cross-sectional view of a display device according to an embodiment.

FIG. 16 is a schematic cross-sectional view of a display device according to an embodiment.

The embodiment of FIG. 16 is different from the embodiment of FIG. 15 in that the third capping layer CAP3 is eliminated and the wavelength control layer CWL is disposed on or directly disposed on a surface of the scattering layer 800 in a display device 10_6.

The wavelength control layer CWL may be disposed on or directly disposed on the surface of the scattering layer 800 of each of the sub-pixels PXn. The lower surface of the wavelength control layer CWL may be in contact with the upper surface of the scattering layer 800. The first capping layer CAP1_1 may be in contact with the outer surface of the lower bank 610 in the space between the adjacent wavelength control layers CWL.

Although the third capping layer CAP3 is eliminated according to this embodiment, the wavelength control layer CWL is encapsulated by the first capping layer CAP1_1, and thus it is possible to prevent the wavelength control layer CWL from being damaged from the outside. The process of forming the third capping layer CAP3 is omitted, so that the efficiency of the process of fabricating the display device 10 can be improved.

Figure 17:
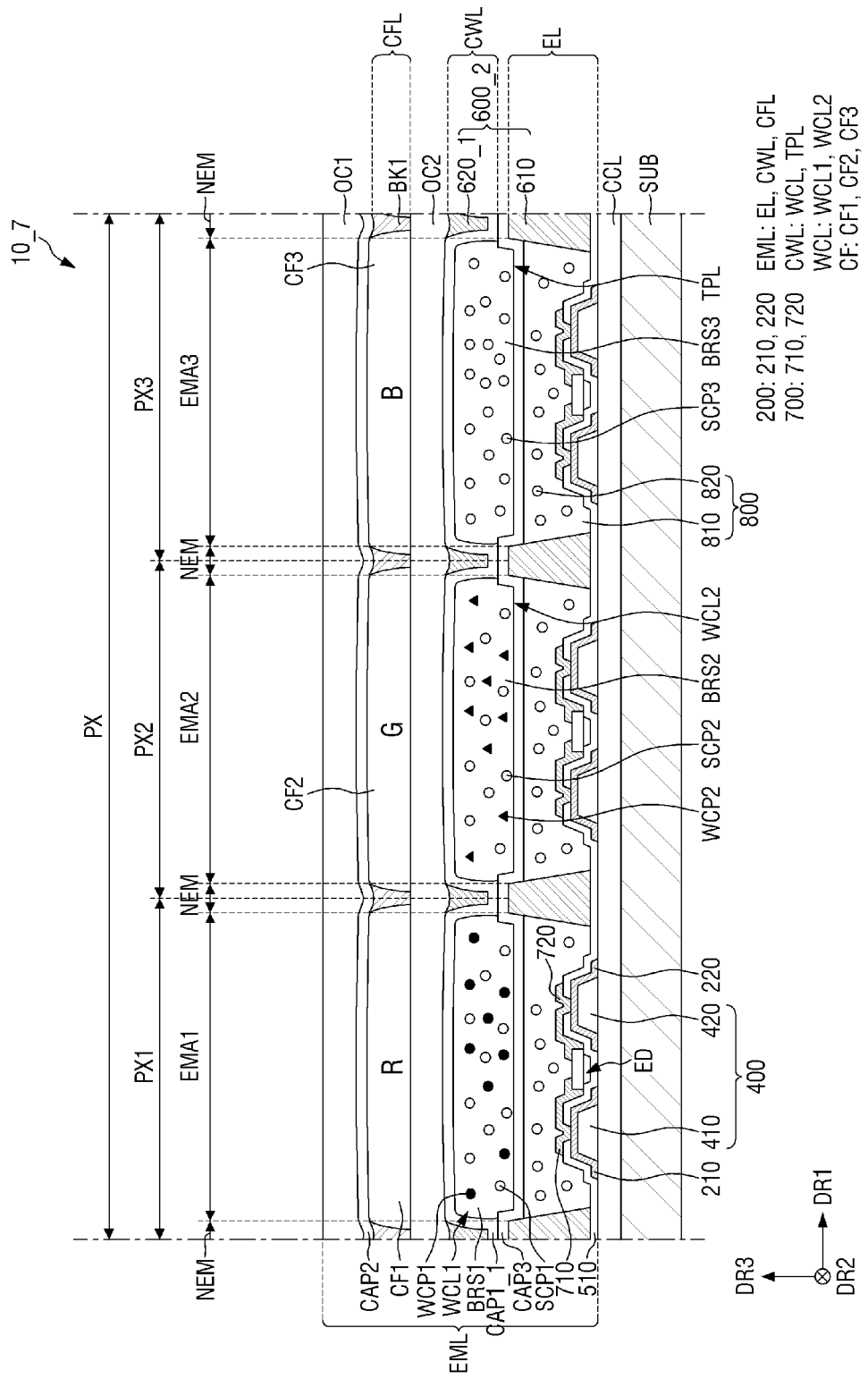
FIG. 17 is a schematic cross-sectional view of a display device according to an embodiment.

FIG. 17 is a schematic cross-sectional view of a display device according to an embodiment.

A display device 10_7 according to the embodiment of FIG. 17 is different from the display device according to the embodiment of FIG. 15 in that a planarization layer OC2 is disposed between the wavelength control layer CWL and the color filter layer CFL.

The planarization layer OC2 may be interposed between the wavelength control layer CWL and the color filter layer CFL. The planarization layer OC2 may be interposed between the first capping layer CAP1 and the color filter layer CFL. The planarization layer OC2 may be disposed along the entire surface of the display device 10. The planarization layer OC2 may be interposed between the wavelength control layer CWL and the color filter layer CFL to provide a flat surface over the wavelength control layer CWL.

The planarization layer OC2 may include an organic material. For example, the planarization layer OC2 may be at least one of an acrylic resin, an epoxy resin, a phenol resin, a polyamide resin, and a polyimide resin. The thickness of the planarization layer OC2 may be in a range of about 0.2 µm to about 10 µm, but the disclosure is not limited thereto.

The protection layer OC1 may include a material having a higher strength than that of the planarization layer OC2 to protect elements thereunder. The thickness of the protection layer OC1 may be in a range of about 0.2 µm to about 500 µm, but the disclosure is not limited thereto. The protection layer OC1 may include a protective film (for example, a low-reflective (LR) film) for reducing light reflectance or suppressing light scattering and surface reflection.

Figure 18:
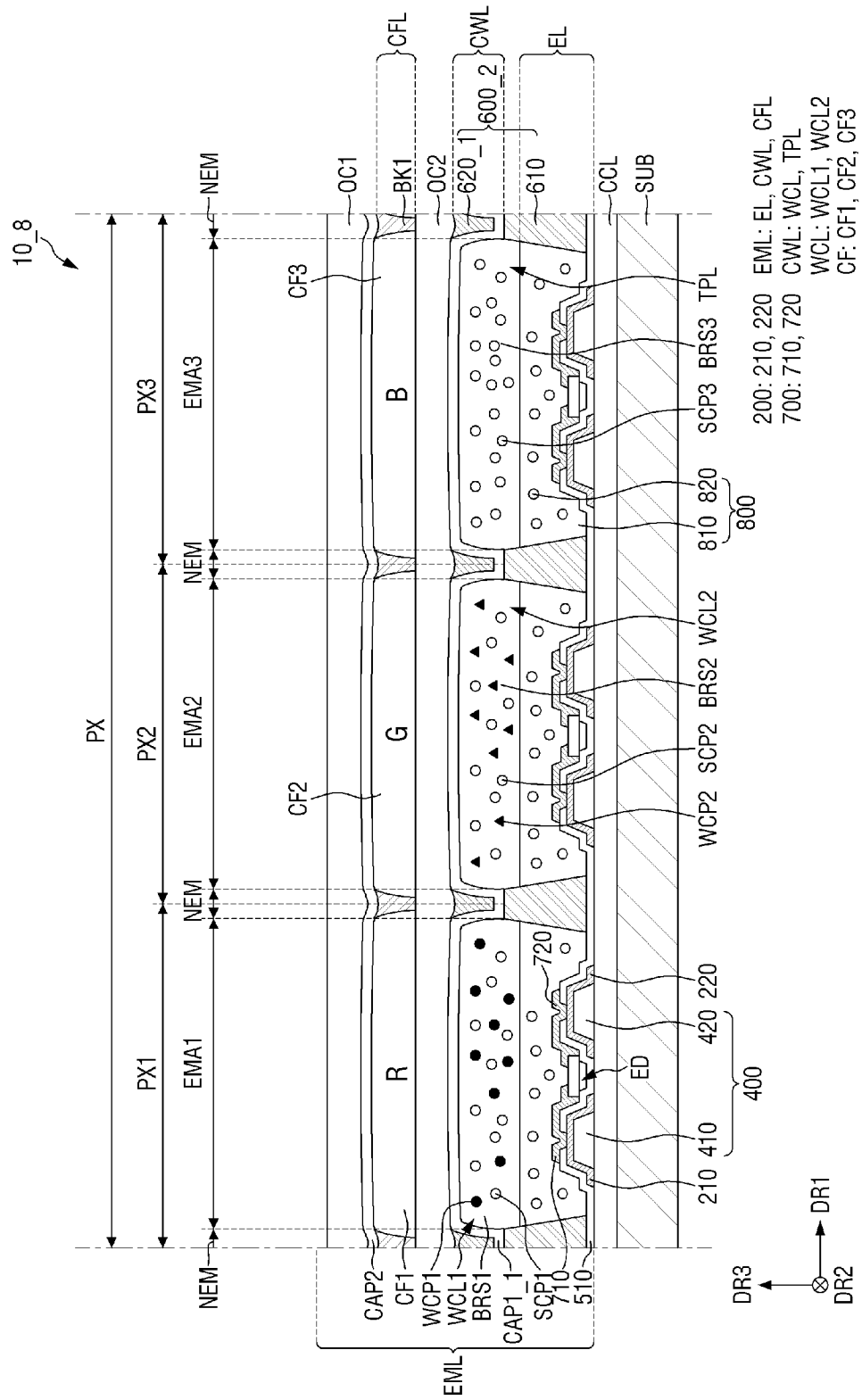
FIG. 18 is a schematic cross-sectional view of a display device according to an embodiment.

FIG. 18 is a schematic cross-sectional view of a display device according to an embodiment.

The embodiment of FIG. 18 is different from the embodiment of FIG. 17 in that the third capping layer CAP3 is eliminated and the wavelength control layer CWL is disposed on or directly disposed on a surface of the scattering layer 800 in a display device 10_8.

The wavelength control layer CWL may be disposed on or directly disposed on the surface of the scattering layer 800 of each sub-pixel PXn. The lower surface of the wavelength control layer CWL may be in contact with the upper surface of the scattering layer 800. The first capping layer CAP1_1 may be in contact with the outer surface of the lower bank 610 in a space between the adjacent wavelength control layers CWL. The planarization layer OC2 may be disposed on the wavelength control layer CWL. The planarization layer OC2 may serve to provide a flat surface over the wavelength control layer CWL.

In concluding the detailed description, those skilled in the art will appreciate that many variations and modifications can be made to the embodiments within the spirit and the scope of the disclosure. Therefore, the disclosed embodiments are used in a generic and descriptive sense only and not for purposes of limitation.

What is claimed is:

1. A display device comprising:
   pixels;
   a first electrode and a second electrode disposed in each of the pixels, the first electrode and the second electrode being spaced apart from each other on a substrate;
   light-emitting elements disposed on the first electrode and the second electrode;

a wavelength control layer disposed on the light-emitting elements; and a scattering layer disposed between the light-emitting elements and the wavelength control layer, the scattering layer comprising light-scattering particles, wherein the scattering layer is spaced apart from another scattering layer and is disposed in each of the pixels, the pixels comprise;
 a first pixel emitting a first color; and
 a second pixel emitting a second color, and the wavelength control layer comprises:
 a first wavelength conversion pattern disposed in the first pixel and converting light of a third color into light of the first color; and
 a second wavelength conversion pattern disposed in the second pixel and converting the light of the third color into the light of the second color.

2. The display device of claim 1, further comprising:
a bank disposed along a boundary of each of the pixels on the substrate, wherein
the bank exposes a portion of each of the first electrode and the second electrode, and
the light-emitting elements are disposed on the portion of each of the first electrode and the second electrode exposed by the bank.

3. The display device of claim 2, wherein at least a portion of a space adjacent to the bank is filled with the scattering layer.

4. The display device of claim 3, wherein the wavelength control layer is disposed in the space adjacent to the bank.

5. The display device of claim 2, wherein the scattering layer overlaps the light-emitting elements and the wavelength control layer in a thickness direction of the substrate, and contacts a side surface of the bank.

6. A display device comprising:
pixels;
a first electrode and a second electrode disposed in each of the pixels, the first electrode and the second electrode being spaced apart from each other on a substrate;
light-emitting elements disposed on the first electrode and the second electrode;
a wavelength control layer disposed on the light-emitting elements;
a scattering layer disposed between the light-emitting elements and the wavelength control layer the scattering layer comprising light-scattering particles; and
a bank disposed along a boundary of each of the pixels on the substrate, wherein
the scattering layer is spaced apart from another scattering layer and is disposed in each of the pixels,
the bank exposes a portion of each of the first electrode and the second electrode,
the light-emitting elements are disposed on the portion of each of the first electrode and the second electrode exposed by the bank,
the bank comprises:
 a lower bank; and
 an upper bank disposed on the lower bank and overlapping the lower bank in a thickness direction of the substrate,
the scattering layer is disposed in an area adjacent to the lower bank, and
the wavelength control layer is disposed in an area adjacent to the upper bank.

7. The display device of claim 1, wherein the scattering layer comprises:

a first scattering layer disposed between the first wavelength conversion pattern and the light-emitting elements, and
a second scattering layer disposed between the second wavelength conversion pattern and the light-emitting elements.

8. The display device of claim 1, wherein the scattering layer further comprises:
a binder layer, and
wherein the light-scattering particles are dispersed in the binder layer.

9. The display device of claim 8, wherein the light-scattering particles comprise inorganic particles including at least one of:
titanium oxide ($TiO_2$), aluminum oxide ($Al_2O_3$), indium oxide ($In_2O_3$), zinc oxide (ZnO), tin oxide ($SnO_2$), silica (Silica), and barium sulfate ($BaSO_4$), or
polymer particles including at least one of polystyrene and polymethyl methacrylate (PMMA).

10. The display device of claim 1, further comprising:
a first contact electrode electrically connecting the first electrode and first ends of the light-emitting elements; and
a second contact electrode electrically connecting the second electrode and second ends of the light-emitting elements.

11. The display device of claim 10, wherein the scattering layer is disposed on the first contact electrode and the second contact electrode.

12. The display device of claim 1, further comprising:
a first capping layer disposed between the wavelength control layer and the scattering layer.

13. A display device comprising:
pixels;
a first electrode and a second electrode disposed in each of the pixels, the first electrode and the second electrode being spaced apart from each other on a substrate;
light-emitting elements disposed on the first electrode and the second electrode;
a wavelength control layer disposed on the light-emitting elements; and
a scattering layer disposed between the light-emitting elements and the wavelength control layer, the scattering layer comprising light-scattering particles, wherein the scattering layer is spaced apart from another scattering layer and is disposed in each of the pixels, and
the display device further comprises:
 a first capping layer disposed between the wavelength control layer and the scattering layer; and
 a second capping layer disposed on the wavelength control layer.

14. A display device comprising:
a substrate comprising an emission area and a non-emission area;
a first electrode and a second electrode at least partially disposed in the emission area and spaced apart from each other;
a light-emitting element disposed in the emission area and disposed on the first electrode and the second electrode;
a color filter disposed in the emission area and disposed on the light-emitting element;
a wavelength control layer disposed in the emission area and disposed between the color filter and the light-emitting element;
a scattering layer disposed in the emission area and disposed between the wavelength control layer and the light-emitting element;

a first capping layer disposed between the wavelength control layer and the color filter; and a second capping layer disposed on the color filter, wherein the color filter is disposed between the second capping layer and the first capping layer, and the scattering layer comprises:
- a binder layer; and
- light-scattering particles dispersed in the binder layer.

15. The display device of claim 14, further comprising: a bank disposed in the non-emission area on the substrate, wherein the bank surrounds the emission area.

16. The display device of claim 15, wherein the wavelength control layer and the scattering layer do not overlap the bank in a thickness direction of the substrate.

17. The display device of claim 16, wherein the scattering layer contacts a side surface of the bank.

18. The display device of claim 16, wherein the wavelength control layer overlaps the scattering layer in the thickness direction of the substrate.

19. The display device of claim 14, wherein a surface of the scattering layer facing the wavelength control layer has a substantially flat surface.

* * * * *